United States Patent
Yang et al.

(10) Patent No.: US 12,119,872 B2
(45) Date of Patent: Oct. 15, 2024

(54) LiFi SYSTEM FOR MRI

(71) Applicant: Lucidity Medical, LLC, Los Angeles, CA (US)

(72) Inventors: Hsin-Jung Yang, Los Angeles, CA (US); Hui Han, New York, NY (US)

(*) Notice: Subject to any disclaimer, the term of this patent is extended or adjusted under 35 U.S.C. 154(b) by 0 days.

(21) Appl. No.: 18/600,708

(22) Filed: Mar. 9, 2024

(65) Prior Publication Data
US 2024/0313859 A1    Sep. 19, 2024

Related U.S. Application Data

(60) Provisional application No. 63/491,018, filed on Mar. 17, 2023.

(51) Int. Cl.
*H04B 10/114*    (2013.01)
*G01R 33/36*    (2006.01)

(52) U.S. Cl.
CPC ..... *H04B 10/1143* (2013.01); *G01R 33/3692* (2013.01)

(58) Field of Classification Search
None
See application file for complete search history.

(56) References Cited

U.S. PATENT DOCUMENTS

| | | | | |
|---|---|---|---|---|
| 5,494,036 A | * | 2/1996 | Uber, III | G01R 33/285 600/432 |
| 2003/0050555 A1 | * | 3/2003 | Critchlow | B60B 33/0073 600/420 |
| 2003/0058502 A1 | * | 3/2003 | Griffiths | G01R 33/283 398/139 |
| 2015/0200996 A1 | * | 7/2015 | Ziarati | H04L 12/2838 709/201 |
| 2018/0144612 A1 | * | 5/2018 | Ziarati | G08B 5/36 |

\* cited by examiner

*Primary Examiner* — David W Lambert
(74) *Attorney, Agent, or Firm* — Metropolis IP Group, LLC; Eric Kang

(57) ABSTRACT

A system for wirelessly communicating data across a magnetic resonance imaging (MRI) observation window, comprising a pair of Light Fidelity (LiFi) modules with a case, wherein each case comprises a window-interfacing-side that is placeable on opposing sides of the observation window, wherein each case further comprises a LiFi transmitter and a LiFi receiver for transmission of control instructions and return information across the observation window.

20 Claims, 17 Drawing Sheets

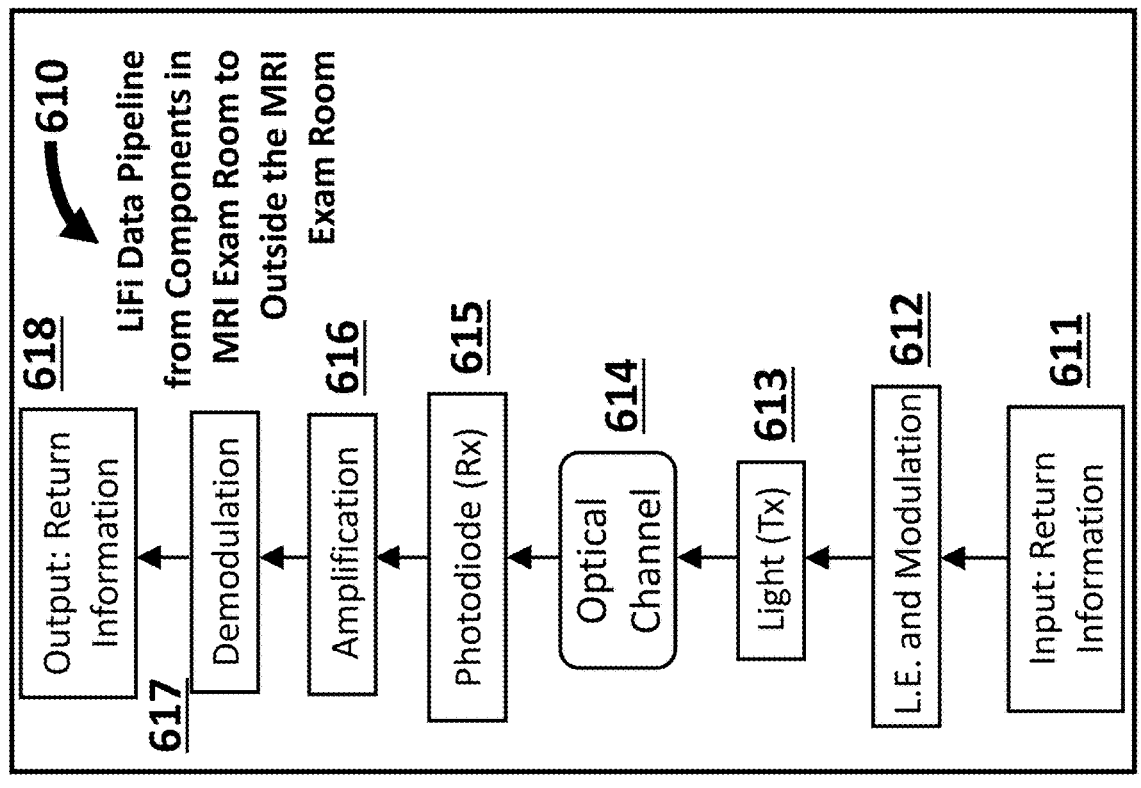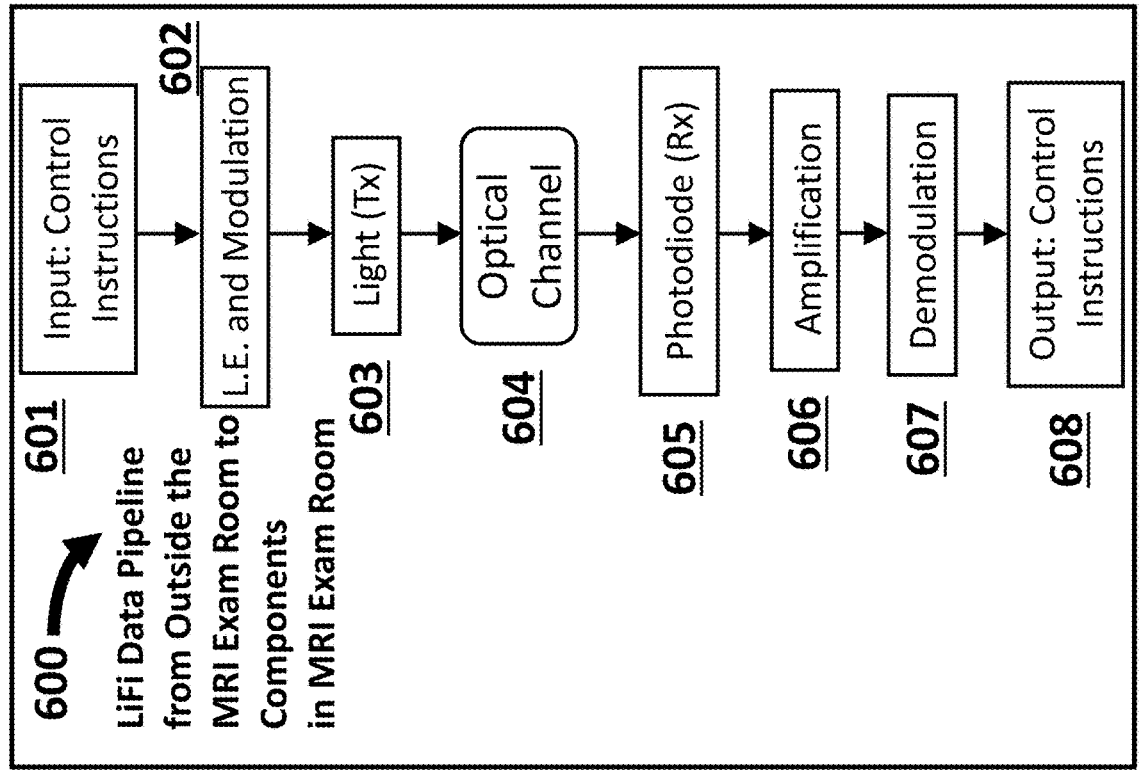
FIG. 2

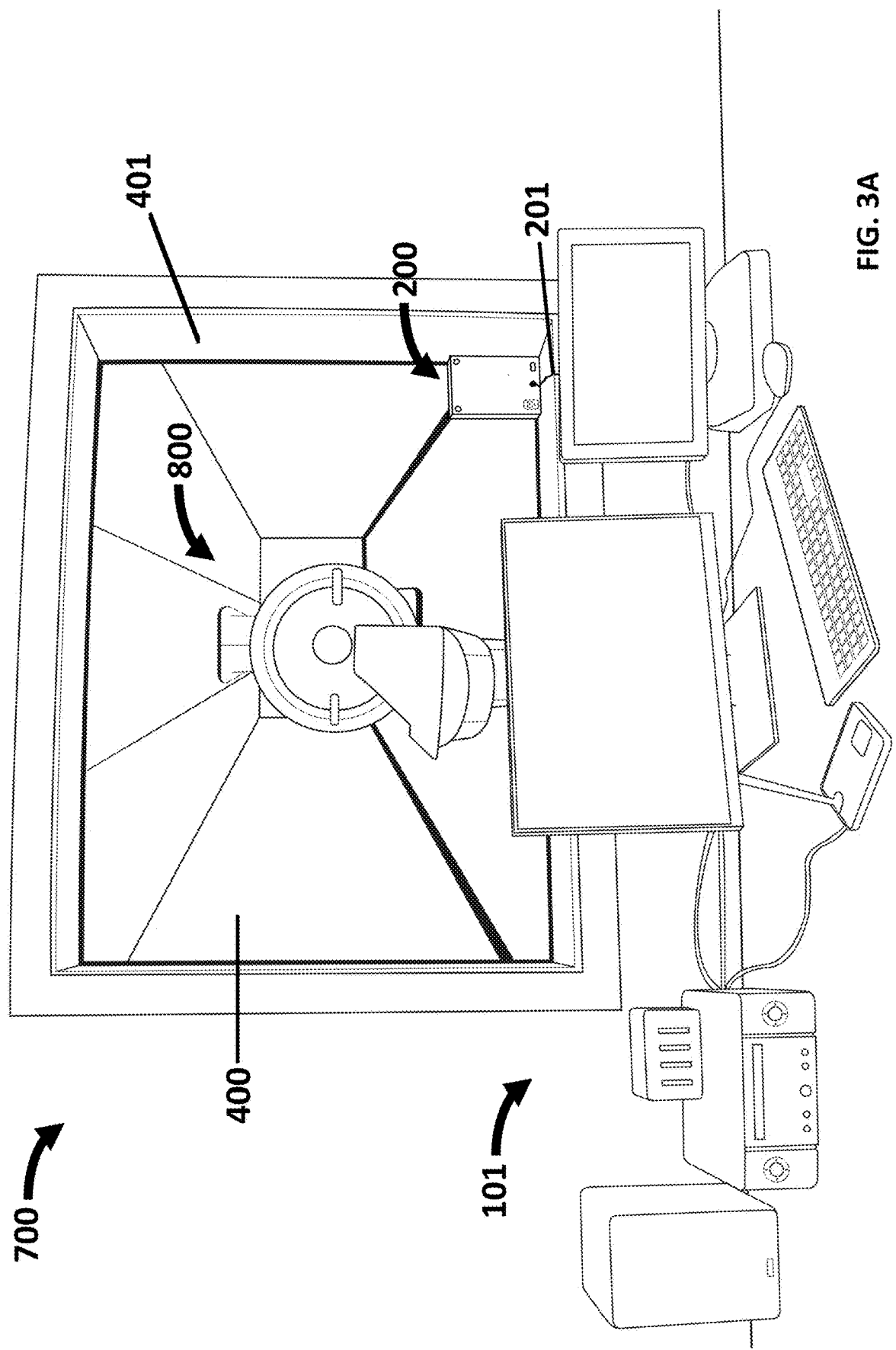

1101
Cleaning/prepping the mating surfaces of the suction cups and specific portions of the window

1102
A. Placing the first LiFi module to the observation window
B. If placed at a corner, pushing the module casing into both edges adjoining at the corner
C. Attaching any separate element (e.g., handle) that is used to assist in final positioning

1103
A. Taking one positioning arm and passing the eyelet of the arm through one of the studs
B. Swinging the positioning arm to its final orientation
C. Tightening a fastener around the stud and pressing the suction cup onto the glass
D. Repeating Steps 1103A-C for the other positioning arm and stud
E. When completed, the positioning arms should form a substantially right angle
F. Removing any previously attached element (e.g., handle); Stop after second LiFi module

1104
A. Placing the second LiFi module along the opposing side of the observation window on the same corner of the first LiFi module and repeating Steps 1102B and 1102C as needed
B. Aligning the second LiFi module by shifting the position as needed until the LED positioning lights associated with one module shine through both alignment holes of the other module OR the through-holes on the first and second module casings are lined up
C. Once the aligned position is achieved, repeating Step 1103 for this LiFi module

FIG. 9

LiFi SYSTEM FOR MRI

CROSS-REFERENCE TO RELATED APPLICATIONS

The present application claims priority to provisional patent application No. 63/491,018 filed on Mar. 17, 2023, disclosures of which are incorporated herein at least by reference.

FIELD OF THE INVENTION

The field of the disclosure described herein relates to systems and methods to adapt wireless optical communications and, in particular, Light Fidelity (LiFi) toward cable-free communications in a Magnetic Resonance Imaging (MRI) environment.

BACKGROUND OF THE INVENTION

Magnetic Resonance Imaging ("MRI") is a commonly used, non-invasive imaging technique used to scan a patient's anatomy using the principles of nuclear magnetic resonance. An MRI system will generally include a magnet capable of producing a very strong magnetic field; a radio frequency ("RF") transmitter and receiver system including a receiver coil around the portion of the patient under study; and a digital image processing system for receiving the signals from the receiver coil and mapping the signals into an interpretable form, such as visual images for viewing by the physician or MRI technician.

An MRI facility will typically include three rooms: an RF-shielded Faraday cage as the "exam room" that is primarily occupied by an MRI scanner and patient table, an 'equipment room' where supporting equipment are located, and a "control room" where an MRI technician performs the imaging study by controlling a host computer and observing the patient through an observation window (optically transparent) during the scans. Aside from safety considerations, the reason the exam room is shielded is that any device or object transmitting or leaking RF signals (in the nuclear resonance frequency) can potentially enter the MRI scanner and corrupt the imaging process. However, there still needs to be a means to send and receive signals between the MRI scanner, patient table, host computer, speaker(s)/headset(s), controlling and monitoring devices, and numerous other devices like power injectors for contrast agent administration, interventional devices for MRI guided treatments, and the other equipment outside of the exam room.

With consideration of the RF shielding constraints, the typical communications link between the exam and control rooms is a network of filtered cables or optical fibers under or through the RF barrier. The communications infrastructure for such implementations is costly and is prone to compromising the RF shielding, which can foul image quality.

Most wireless communication teachings in an MRI environment are restricted to RF signals at a frequency that is benign to MRIs. The range of an MRI scanner is typically 64 MHz+/−250 kHz for a 1.5 Tesla (T) system and 128 MHz+/−250 KHz for a 3 T system.

For example, Griffiths' Publication (US 2005/0107681 A1) is narrowly drawn to a communications module for wirelessly communicating electrocardiogra (ECG) signals in the higher frequency microwave spectrum. Anderson et al.'s Patent (U.S. Pat. No. 11,374,646 B2) teaches an RF wireless bridge for generally operating devices in the exam room operating in a "frequency band that lies above 2 GHZ." Susi's Patent (U.S. Pat. No. 10,617,821 B2) narrowly discloses a wireless means to control an infusion pump, where communication embodiments are transmitted in a channel operating from 2.400 GHz to 2.482 GHz in one embodiment and in another embodiment operating in a Bluetooth® compatible band stretching from 2.400 GHz to 2.4835 GHz with a lower guard band of 2 MHz and an upper guard band of 3.5 MHz.

The shielding for the exam room is designed to significantly attenuate electromagnetic fields under 130 MHz, as most MRI systems operate from 4 MHZ to 130 MHz. However, the issue here, and one that adversely impacts prior RF-based wireless approaches, is the RF shielding of exam rooms commonly attenuates wider frequency ranges that are not targeted to avoid potential signal interference (up to 30 GHZ), such as 2.4 GHz signals used for wireless communication. Achieving −100 dB attenuation of targeted signals may inadvertently result in −70 to −80 dB attenuation of signals in the 2.4 GHz range. Furthermore, there are only so many allotted microwave communications frequencies that can be performed license-free; they are 915 MHZ, 2.4 GHZ, or 5.8 GHz Industrial, Scientific, and Medical (ISM) bands for communication.

Hence, a clean slate approach is required to address the cross-barrier MRI communications challenges, such as a wireless optical approach. Kormos et al.'s Patent (U.S. Pat. No. 6,198,285 BI) teaches an infrared ("IR") transmitter outside the exam room that sends device control signals to a receiver within the exam room that is arranged to allow control of the MRI scanner. However, due likely to bandwidth limitations, the "control signals are transmitted out from the exam room to the computer processors and controls via fiber optic cables." Hence, this is often not bi-directional and the earlier discussed cabling issue remains.

Frazier et al.'s PCT Publication (WO 01/92907 A2), in view of method claim 26 and FIG. 3A teaches "positioning a first passive light transmitting assembly adjacent a translucent window in the isolation barrier on the outside of the isolation barrier; positioning a second passive light transmitting assembly adjacent the window on the interior of the isolation barrier in general alignment with the first light transmitting assembly such that light energy can be transmitted therebetween; and connecting the second light transmitting assembly via optical cable to a communication unit positioned within a shielded housing within the isolation barrier." However, the described method is impractical. Specifically, the method attempted to "couple" optical fibers through the observation window with "passive" optical elements. To perform effective optical fiber coupling, fiber couplers are often used to match the optical mode, preserve sufficient light energy, and prevent contamination from ambient light. However, for shielding purposes, observation windows are commonly constructed with multiple layers of glass. This hinders the coupling ability of a passive system with multiple optical interfaces that reflect and scatter the light signal and consequently leads to significant light leakage, signal attenuation, and contamination that makes fiber coupling through observation windows nearly impossible. Furthermore, the specifications from the invention are completely silent or provide no enabling disclosure on transmitter/receiver coupling, device alignment, the distinction between lighting for transmission and receiving via photodiode, optical shielding/masking, frequencies of operation, software driver implementations, critical data processing steps like modulation and demodulation, how bi-directional communications are achieved as illustrated, etc.

Approximately a decade after Frazier's PCT Publication date (WO 01/92907 A2) of Dec. 6, 2001, a new optically-based Visible Light Communications (VLC) technology called Light Fidelity (LiFi) was introduced. Li-Fi transmits data at extremely high rates (currently, researchers have achieved over 224 Gbits/second) over visible light, ultra-violet, and infrared spectrums using active lighting means (e.g., LED lamps) and do so at a potentially far lower cost than WiFi®. Its very nature lends itself to use in an electromagnetically noisy and sensitive environment like an MRI exam room.

However, one cannot simply "bolt on" an off-shelf LiFi system and expect it to readily work for MRI applications, particularly between MRI "rooms." The systems require 'MRI compatibility' to avoid magnetic field and RF field risks in an MRI environment while mitigating the light fidelity limitations, such as avoiding interference from upstream/downstream channels and ambient lights and maintaining enough light brightness with stable line-of-sight (LOS) intra- and inter-MRI rooms.

SUMMARY OF THE INVENTION

The present disclosure describes a novel system and method that adapts LiFi technology for bi-directional communications in an MRI environment or inter-RF-shielded MRI rooms and addresses all the previously mentioned shortcomings and concerns of the prior art. The system aspect of the present invention comprises a pair of modules—one on each side of the substantially transparent MRI observation window—that integrate LiFi optical hardware and communications electronics and in certain embodiments accept certain positioning and securement provisions to help assure optimal data throughput.

The areas that are addressed with various embodiments of the present invention include but are not limited to a system designed to mitigate MRI-related magnetic field and RF risks, to mount and align the LiFi module, to prevent crosstalk between uplink and downlink signals, to isolate the optical channels from environmental interference, an alignment calibration function and an attachment function to position, align, and secure the system, and a system to set up, troubleshoot, and manage the LiFi devices.

Several key aspects of the system relate to a case design that houses LiFi transmitters, receivers, and associated circuitry in a manner that supports the uplink of control instructions and downlink of return data without risks of interference or cross-talk between the uplink and downlink communication pipelines. Embodiments include cavities within the separate modules for the control room and MRI exam room that can have optically isolate a LiFi transmitter or receiver in the uplink pipeline from the LiFi receiver or transmitter for the downlink pipeline, respectively. Alternative embodiments without a partition may have the uplink and downlink operate on different optical frequencies. Another alternative embodiment allows the LiFi transmitter/receiver pair for the uplink and downlink to operate with a LOS that is not orthogonal to the MRI observation window. In all embodiments, the LoS of the uplink data pipeline and the LoS of said downlink data pipeline are geometrically decoupled from each other.

BRIEF DESCRIPTION OF THE DRAWINGS

The drawings are provided to facilitate understanding in the detailed description. It should be noted that the drawing figures may be in simplified form and might not be to precise scale. In reference to the disclosure herein, for purposes of convenience and clarity, only directional terms such as top, bottom, left, right, up, down, over, above, below, beneath, rear, front, distal, and proximal are used with respect to the accompanying drawings. Such directional terms should not be construed to limit the scope of the embodiment in any manner.

Portions of certain figures are accompanied by icons depicting actions, processes, process states, and items. These icons are meant to efficiently convey information in an impactful and potentially more universal manner. Any ambiguity in an icon's meaning is clarified by content provided in the DETAILED DESCRIPTION OF THE INVENTION and not be construed to limit the scope of the embodiment in any manner. Embodiments of the methods and systems represented in the drawings as block diagrams and flowcharts are illustrations of methods, systems, apparatuses, and computer program products.

FIG. 2 shows a block diagram of the uplink LiFi data pipeline from the MRI control room to MRI exam room (left) and another block diagram of the downlink LiFi data pipeline from the MRI exam room to MRI control room (right)

FIG. 3A shows the perspective from the MRI control room with a LiFi module mounted on the lower right of the observation window using a mounting embodiment comprising the use of adhesives

FIG. 9 is a block diagram outlining the steps for mounting an embodiment of the LiFi module

DETAILED DESCRIPTION OF THE INVENTION

Figure 1:
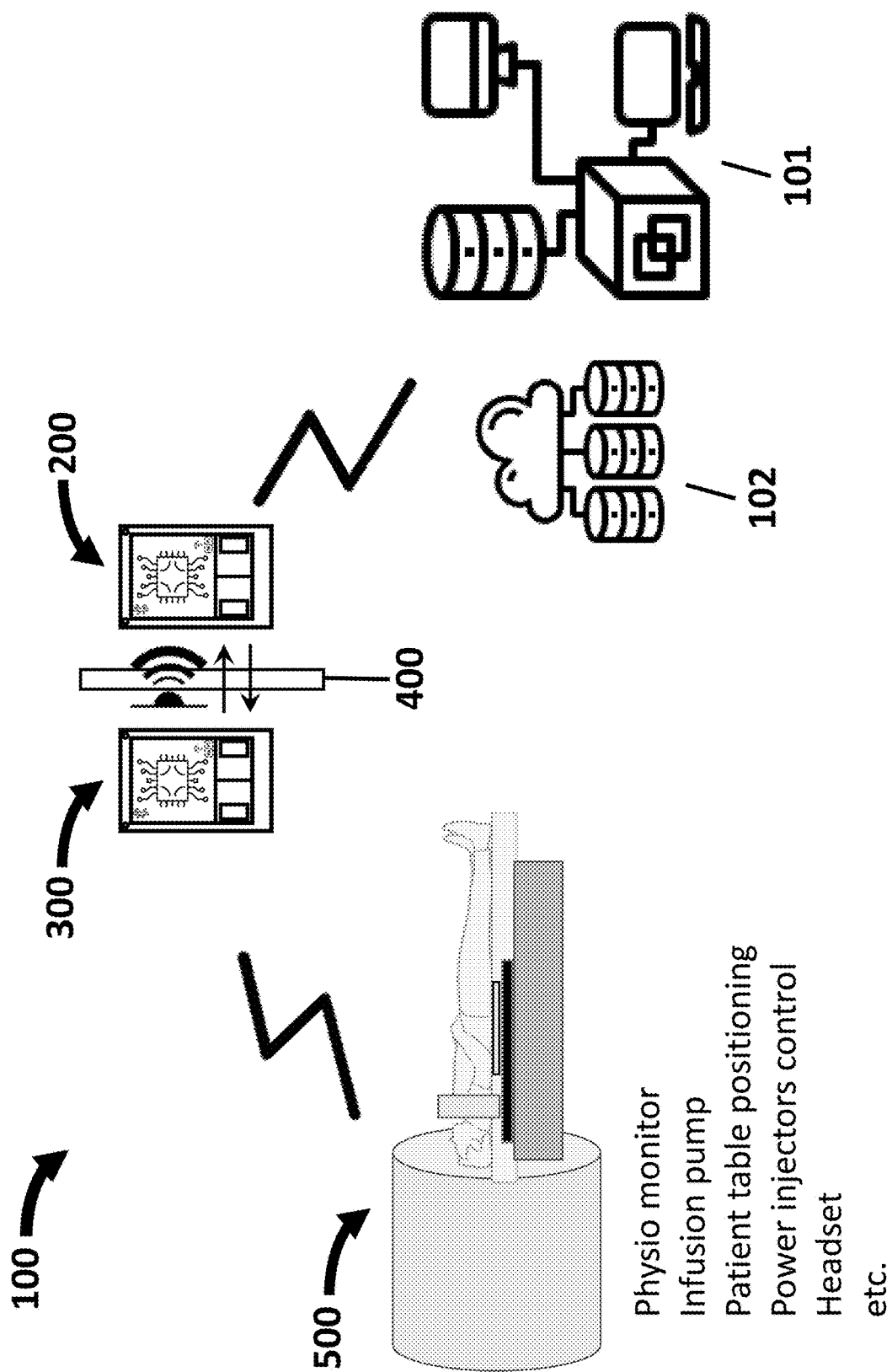
FIG. 1 is a schematic showing the elements of a LiFi communications network and devices receiving or transmitting data within this network

The present invention discloses a wireless optical communications system 100 as applied for an MRI system and environment shown in FIG. 1, which comprises a pair of modules 200, 300 that integrate LiFi optical hardware and communications electronics to carry out communications across an RF-shielded but substantially transparent observation window 400 between equipment 101, 102 outside the exam room ("OER") and the equipment 500 within the exam room. Functions 600, 610 within the data communications pipeline to and from the exam room are indicated in FIG. 2. These modules 200, 300 are situated on the control room 700 and exam room 800 sides of the observation window 400, respectively, as shown in FIGS. 3A, 3B, 4A, and 4B. For this disclosure, control room 700 also refers to any location OER.

Modules 200, 300, and module casing are designed to accept data and power cables, house electronic and optical hardware, and work with alignment calibration and attachment functions or features for positioning, alignment, and securement. These are depicted in FIGS. 5A-C, 6, and 7.

Figure 7:
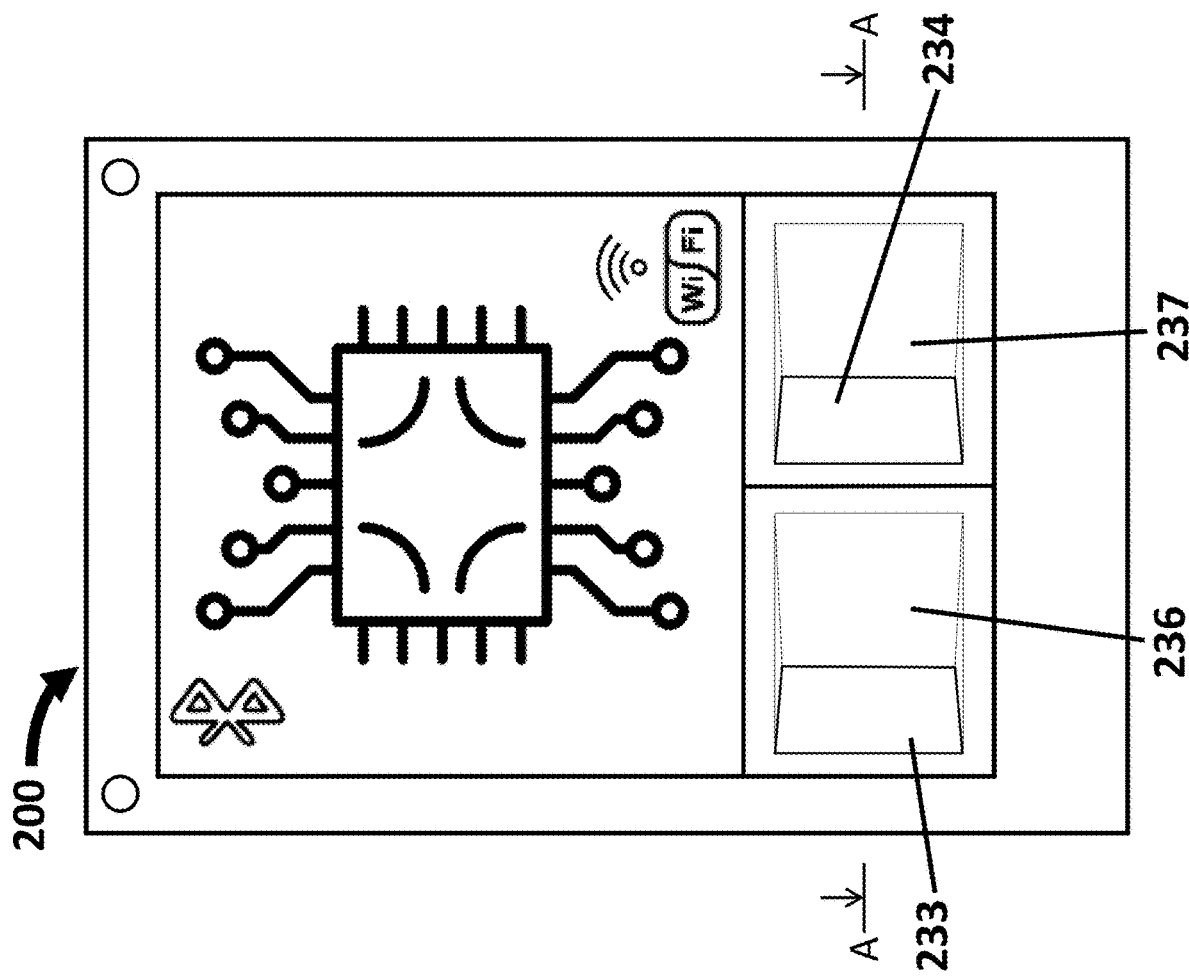
FIG. 7 is an orthogonal view showing the window-interfacing-side and layout of a LiFi module's casing comprising a pair of alignment holes or LED lights, an angled LiFi transmitter, an angled LiFi receiver, and an electronics bay where the electrical components to support communication functions reside
Figure 8:
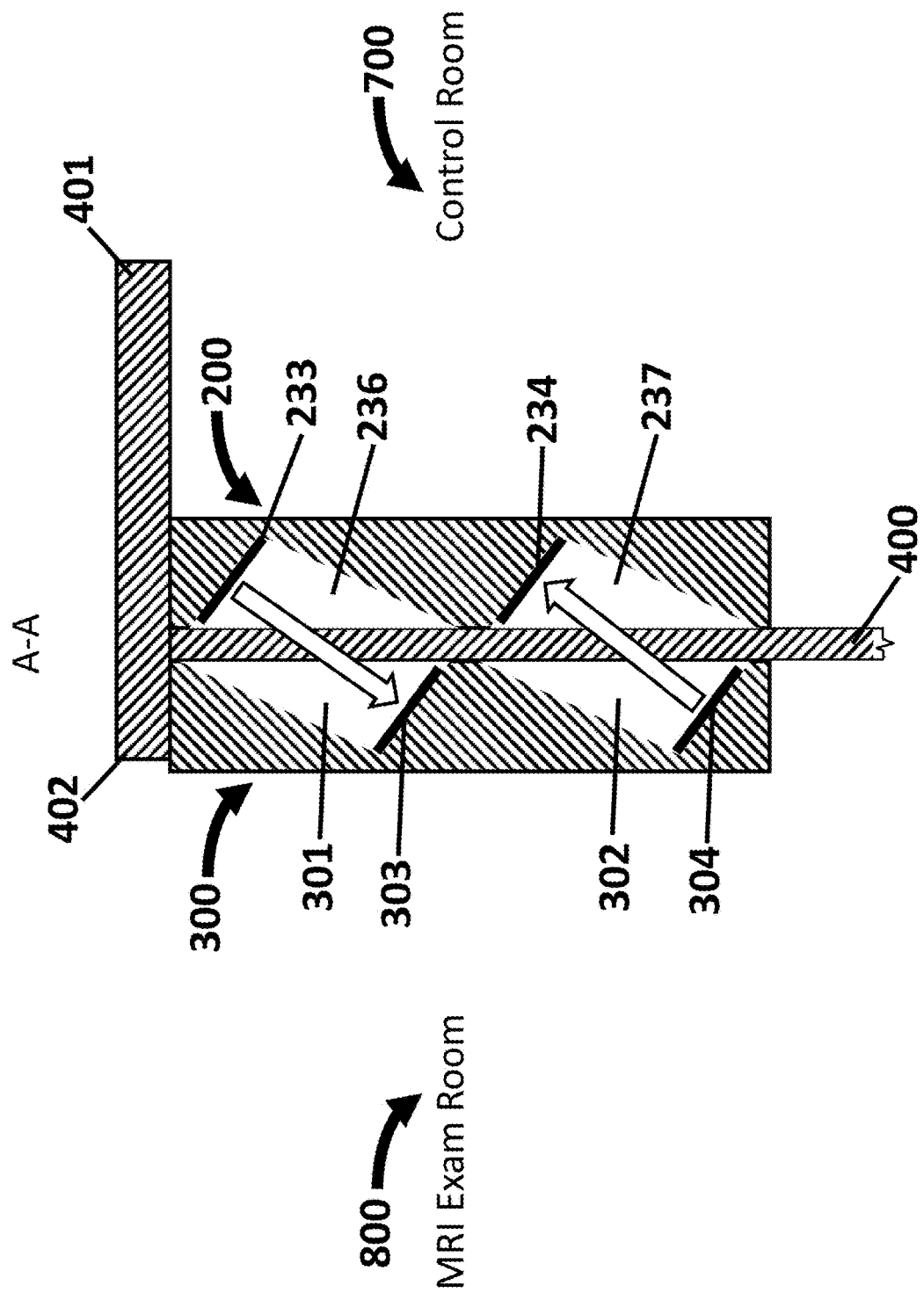
FIG. 8 shows a sectional A-A view of an embodiment of the LiFi modules with angled LiFi transmitters and receivers and a depiction of the uplink and downlink light propagation

An embodiment of the present invention has LiFi transmitters and receivers arranged at an angle to minimize or eliminate crosstalk and maximize data throughput, and this is illustrated in FIGS. 7-8. FIGS. 9 and 10A-C describe and illustrate elements and method 1100 of positioning, aligning, and securing the control room module 200 to the observation window 400, and is analogous to the procedure for performing the same for the exam room module 300. After physical installation, the LiFi communications system 100 needs to be initiated and maintained. FIG. 11 is a block diagram showing, among several aspects, the elements of the software application 1200B needed to initiate/set up, manage, and troubleshoot the operation of the LiFi communications system as adapted for MRI applications 1. LiFi Communications Network for MRI Applications FIG. 1 provides an overview of a wireless LiFi communications system 100 as applied for MRI and how it fits into the overall communications infrastructure. The control room or "OER" 700 can have a network of computers, equipment, and machines, collectively called "OER devices" 101, 102. A subset of these OER devices 101, 102 can include hardware and operating system software to allow the end user to interact with equipment 500 within the exam room 800 ("ERE devices") over this communications system. The operating system may be or include a variety of operating systems such as the Android®, Macintosh® OS or iOS, Microsoft Windows®, Unix, Linux, Xenix, IBM AIX™, Hewlett Packard UX™, Novell Netware™, the Sun Microsystems 35 Solaris™, OS/2™, BeOS™ Apache™, OpenStep™, or another operating system or platform.

Exemplary OER and ERE devices 101, 102, 500 and electronics within the LiFi modules 200, 300 can comprise a desktop personal computer (PC), laptop/notebook personal computer, portable mobile device (tablet, smartphone), or any hardware apparatus that includes a processor or plurality of processors, system memory (i.e., RAM/ROM/cache), large permanent (i.e., non-volatile) local data storage where an operating system, hardware drivers, applications, and applications are stored, optional removable flash memory (e.g., regular/mini/micro-SD cards, thumb drives), optional disk drives, remote cloud storage directly linked to the device, built-in or connected external I/O devices (e.g., buttons, monitor, capacitive touchscreen, trackpad, speaker, jack(s)/port(s) to connect to external devices), network adaptor(s), router(s), signal repeater(s), hardware drivers to control external devices like speaker(s), display(s), monitor(s), camera(s), and a bus that couples various system components including the system memory to the processor(s). For embodiments requiring wireless connectivity, the device also has radio hardware, circuitry, and drivers to enable such communications.

At a minimum, the memory of the devices within the communications network 100 includes at least one set of instructions that is either permanently or temporarily stored. The processor executes the instructions that are stored in order to process data. The set of instructions may include various instructions that perform a particular task or multiple tasks. Such a set of instructions for performing a particular task may be characterized as a program, software program, software, engine, module, component, mechanism, or tool. Each of the devices within the communications network 100 may include a plurality of software processing modules stored in a memory as described above and executed on a processor in the manner described herein. The program modules may be in the form of any suitable programming language, which is converted to machine language or object code to allow the processor or processors to read the instructions. That is, written lines of programming code or source code, in a particular programming language, may be converted to machine language using a compiler, assembler, or interpreter. The machine language may be binary-coded machine instructions specific to a particular computer.

It should be appreciated that the processors and/or memories of the devices within the communications network 100 need not be physically in the same location, such as in remote or cloud storage 102. Each of the processors and each of the memories used by these devices may be in geographically distinct locations and be connected to communicate with each other in any suitable manner. Additionally, it is recognized that each of the processors and/or memory may be composed of different physical pieces of equipment.

To respond to requests for data or requests to store data, the data storage server may query its database to retrieve or store various data, such as a user's profile, document or multi-media content, and other content that will be described in a later section describing the LiFi Module Software Application. The database may be a relational database responsive to Structured Query Language ("SQL") commands. The behavior adapter server may execute a hypertext preprocessor ("PHP") script including SQL commands to query the database for various data.

Within the exam room, the ERE devices 500 can include monitoring equipment comprising one or more video cameras, microphone(s), patient vital monitors (e.g., blood pressure, oxygen, carbon dioxide, ECG, etc., motion/proximity detectors, and pressure sensors; MRI function, control, and data transportation hardware comprising therapeutic devices, interventional devices, fMRI devices (for stimulation, synchronization, etc.), shimming coils, RF coils, gradient coils, image data transportation, motion correction devices, patient table positioning, power injector, infusion pump, anesthesia control, ventilation control, phantom control, robotic control, and magnetic gradient system to localize the volume encapsulating the patient's anatomy under study; and multi-media equipment comprising a screen/monitor, speakers, and headset.

Within the exam room 800 or control room 700, but not across the observation window 400, the data network connecting the various devices, in an embodiment, may be implemented as a single network or a combination of multiple networks. Various networks may be implemented in accordance with embodiments of the invention, including a wired or wireless local area network (LAN) and a wide area network (WAN), a wireless personal area network (PAN), and other types of networks. When used in a LAN networking environment, computers/devices may be connected to the LAN through a network interface or adapter. When used in a WAN networking environment, devices typically include a modem or other communication mechanism. In another example, the network may comprise a wireless telecommunications network (e.g., cellular phone network) adapted to communicate with other communication networks, such as the Internet.

Hence, embodiments of the present invention include the ability for the devices and Platform to send and access data locally (e.g., Local Area Network, LAN) as well as send/receive signals to peripheral devices using a wired or wireless connection. An intermediary router can be used to connect local system devices as well as to a modem (not shown) for internet access. The router can be combined with a modem for internet access. Alternatively, the devices may directly access the internet with an appropriate built-in radio, circuitry, and supporting wireless telecommunications network.

Some suitable communications protocols may include TCP/IP, UDP, or OSI, for example. For wireless communications, communications protocols may include Bluetooth®, Zigbee®, IrDa, Wi-Fi®, 2G, 3G, Ultra-Wideband, and Long-Term Evolution (LTE) or other suitable protocols. The wireless communications protocol may also include short-range communications devices and protocols, such as RFID, or Near-Field Communication radio transmissions. Furthermore, components of the system may communicate through a combination of wired or wireless paths.

Although many other internal components of the computer are not shown, those of ordinary skill in the art will appreciate that such components and the interconnections are well known. Accordingly, additional details concerning the internal construction of the computer need not be disclosed in connection with the present invention.

In addition, the instructions and/or data used in the practice of the invention may utilize any compression or encryption technique or algorithm, as may be desired. An encryption module might be used to encrypt data. Further, files or other data may be decrypted using a suitable decryption module.

Another aspect of the invention relates to mitigating the risk of magnetic field-induced mechanical force by implementing location designs (outside of the 5 Gauss line) and/or adopting electronic components with low magnetic susceptibility. Yet another aspect of the invention relates to mitigating potential RF risks by using electrical components, power modules, and cables with proper RF properties (operating at a different frequency from the MRI scanner, RF-shielded, and avoiding long wires in the modules) to ensure MRI compatibility.

2. Data Pipeline for LiFi Communications in MRI Applications

FIG. 2 shows a pair of block diagrams 600, 610 which illustrate the data communications or transformation pipeline ("data pipeline") from data sourced from devices outside the MRI exam room (OER) or control room 700 to components inside the MRI exam room 800 and back, respectively. Alternatively, block diagram 600 represents the uplink communications branch or the uplink data pipeline for control instructions or data, and block diagram 610 represents the downlink communications branch or the downlink data pipeline for return information. Note, even though the OER devices 101, 102 may not all be in the room adjoining the observation window 400 where the MRI technician typically operates, for brevity, the setting outside the MRI exam room (OER) will hereinafter be called the "control room" or "MRI control room."

Block 601 represents the step where information and/or commands are submitted from the control room 700 and can originate from actions by the MRI technician on an input device as part of equipment 101 discussed earlier. These actions can be interacting with a graphical user interface (GUI) on a software application, typing onto a keyboard, or actuating a controller to perform actions such as positioning the patient table, energizing the infusion pump to administer contrast agent into the patient, localizing the volume encapsulating the patient's anatomy to be captured on images, projecting speech, and/or controlling the operation of other ERE devices 500 mentioned earlier. If the input information is analog, then a converter maps the analog information into a binary/digital bitstream using an analog-to-digital converter (ADC).

If the input data 601 is transmitted from equipment 101 to the control room module 200 via wireless means (e.g., Bluetooth®, WiFi®, etc.), then an additional step before starting the step of block 602 to assure data integrity may also be incorporated, and is commonly known in the art. Specifically, traffic congestion can cause input/output packet discards on interface links, especially when translating between disparate link speeds (10 Gbps to 1 Gbps for example). On these connections, the egress link may not be able to properly track the ingress traffic, which may result in dropped packets. The wireless network under a connection protocol like TCP will track data that has been sent and received and assess whether a packet has been received or not. If a packet loss (discard) has occurred, the wireless network transmitter will resend it accordingly, ensuring reliable transmission of data. The means for performing this additional step may be carried out by wireless communication components to be discussed in the section covering LIFI MODULE SYSTEM AND EMBODIMENTS.

This inputted data 601 needs to undergo the process of line encoding and modulation 602 by a digital-to-analog converter (DAC). Line encoding converts the digital bit stream into a very high-frequency (visible light, ultraviolet, and infrared spectrums) digital signal whose amplitude is modulated and conveyed onto the optical signal output from the transmitter 603. The frequency transmitted by the optical transmitter may operate in the 400-800 THz range.

The means of modulation can comprise an Intensity Modulation/Direct Detection (IM/DD) system with a real-valued-unipolar modulation-signal, using schemes to techniques like On-Off Keying (OOK), Pulse Position modulation (PPM), Pulse Width Modulation (PWM) and Unipolar Pulse Amplitude Modulation (PAM). Since these modulation schemes introduce Inter Symbol Interference (ISI) along the communication channel, an Orthogonal Frequency Division Multiplexing (OFDM) technique [Optical OFDM for visible light communications. Qi Wang Zhaocheng Wang, Tianqi Mao. s.l.: 13th International Wireless Communications and Mobile Computing Conference, 2017] or alternative methods can be applied during modulation. The OOK method represents data with a logic value of zero for LOW and a logic value of one to HIGH. When implemented for LiFi optical transmission, this means the LED is turned off to transmit a zero and turned on to transmit a one. This modulator also comprises a transconductance amplifier to help achieve the proper light intensity (amplitude modulation) and bandpass filter(s) to further condition the data.

For information and commands targeted to different end destinations among ERE devices 500, multiple channels may be allocated, and/or signal multiplexing on a single channel may be implemented. An LED driver circuit converts the modulated data into an optical signal to be transmitted in step 603 that will propagate through the optical channel 604.

The (Tx) 603 can be a wavelength-specific, high-frequency flicker-capable LED semiconductor that receives electrons from electrical current flow and bonds with holes in the substrate to release electromagnetic energy in the form of photons. The LED can be powered by a low voltage and current source at a frequency range of around 100 Hz to 250 GHz. The light source 603 may alternatively be a laser diode.

An optical channel 604 bridges the transmission and receiving ends of an uplink or downlink optical data transfer conduit. For the purposes of LiFi, this may be air, vacuum evacuated of dust and particles, optical fiber, or some other medium. Invariably, the optical channel 603 includes portions of the observation window 400 where the LiFi light passes through. One of the design objectives of the optical channel 604, but excluding the observation window 400, is to minimize the physical gap between the light source and observation window to avoid scatter and reflection. Embodiments of the present invention's optical channel may be a gel waveguide filling the cavity surrounding the transmitter 603 and receiver 605. An example of such may be SILICON SOLUTIONS' "SS-988 Non-Curing Optical Coupling Gel-V-788 Offset" optical couplant. A lens may be optionally placed in the optical channel 604 to focus light incoming to receiver 605 if the light intensity is low.

The light transmitted from the source 603 of the control room module 200 through the optical channel 604 is targeted toward the receiver 605 of the separate exam room module 300 placed on the opposite side of the observation window 400. The receiver 605 is preferably a photodiode, which is a semiconductor for converting optical power into electrical impulses and preferably has a quick response time and needs to be spectrally sensitive in the optical spectrum of interest (e.g., IR, visible, UV), and large radiant sensitive area. For visible spectrum applications, a photon detector (e.g., photodiode, CCD, etc.) preferably has a spectral bandwidth from 300 nm to 1500 nm, a linear light intensity to current ratio, and a radiant sensitive area is 7.5 $mm^2$, a rise and fall time of 3 us each, which provides a switching frequency of 922 kHz.

Additional hardware may be used to filter and interpret incoming signals. For example, a suitable band pass filter can be used to filter out incoming signals with frequencies other than those desired; an optical filter can be an effective way to filter out light of other wavelengths.

The current and voltage which is generated by the photodiode 605 are of very low value. In practice, the voltage would be amplified 606 with an op-amp (transimpedance amplifier) to increase the magnitude of the signal suitable for input to the demodulation 607 step. Transistor-based amplifier circuitry may be used as necessary to augment 606 signal strength.

The output from the photodiode is in analog form, and therefore, an analog-to-digital converter (ADC) is necessary to put it into a form that is usable for the demodulator. The resulting digital signal then needs to be demodulated 607 back to a sequence of bits. Depending on the destination ERE device 500, the output 607 will be in analog or digital form. If analog, a DAC is needed once again. Further signal conditioning may need to be done to properly interface with the particular ERE 500 of interest.

The information returned from the exam room 800 will follow the same process 610 as that from the control room 600. Hence the process steps 611-618 are analogous to steps 601-608. However in the downlink branch 610, unless there is haptic feedback as in a remote surgery setting, the information will not have a control objective. Return information can comprise imaging data from the scanner, audio from a microphone, patient table position sensors, equipment diagnostic information, etc.

3. Installed Layout of MRI-Specific LiFi Modules

Figure 3B:
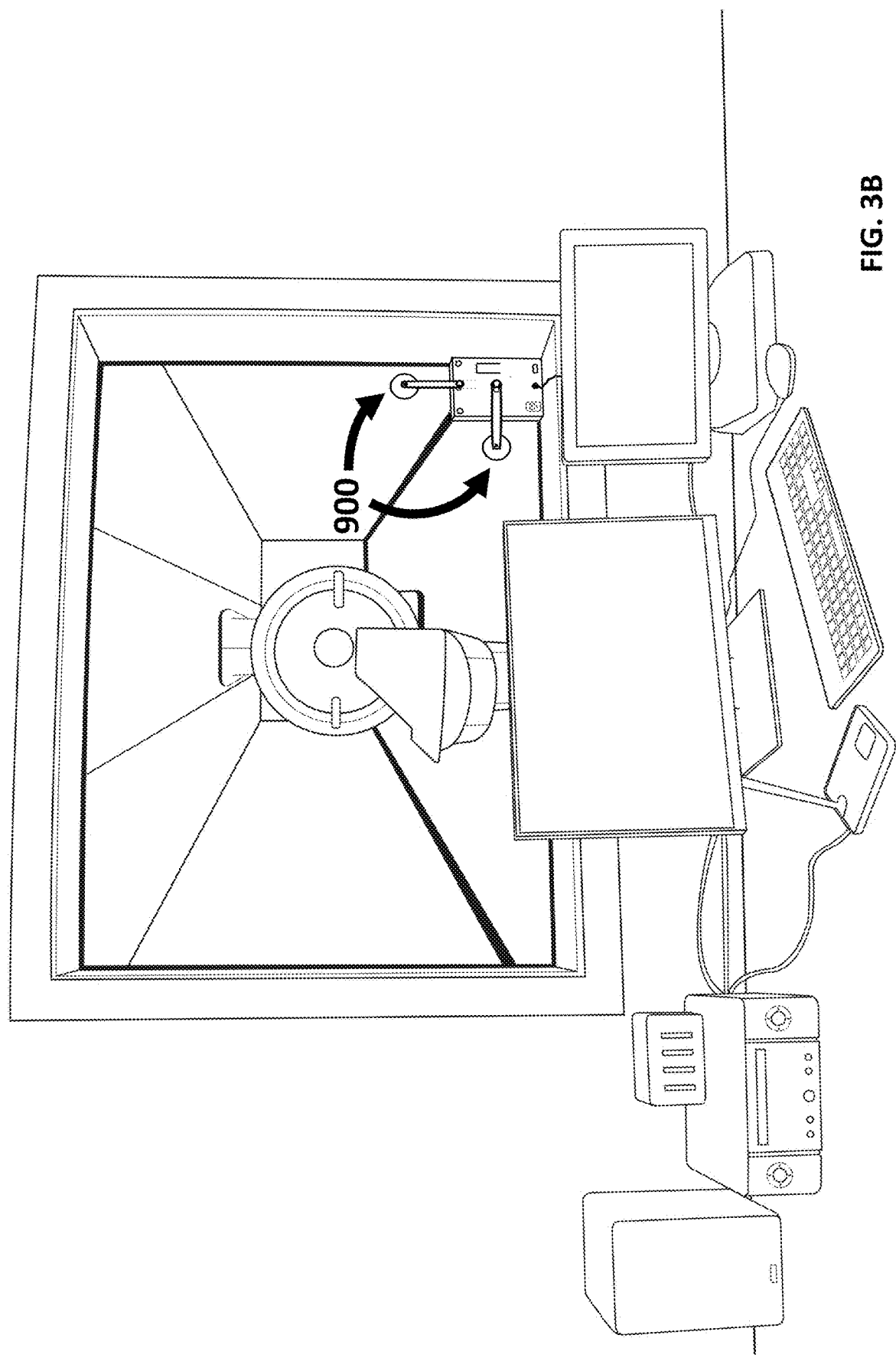
FIG. 3B shows the perspective from the MRI control room with a LiFi module mounted on the lower right of the observation window using a mounting embodiment comprising the use of a pair of positioning arms comprising a suction cup, thin plate arm, pin, and eyelet
Figure 4A:
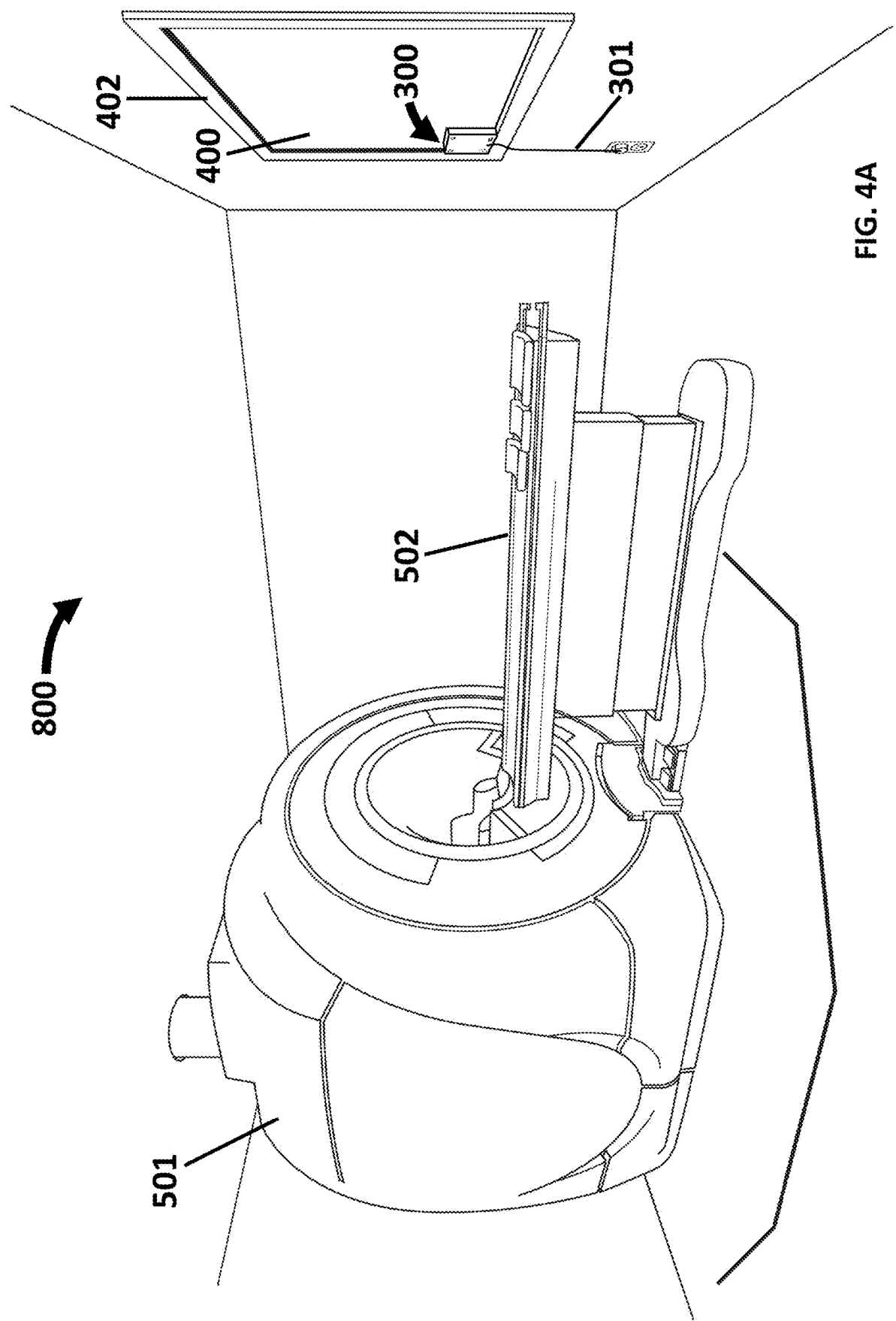
FIG. 4A shows the perspective from the MRI exam room with a LiFi module mounted on the lower left of the observation window using a mounting embodiment comprising the use of adhesives
Figure 4B:
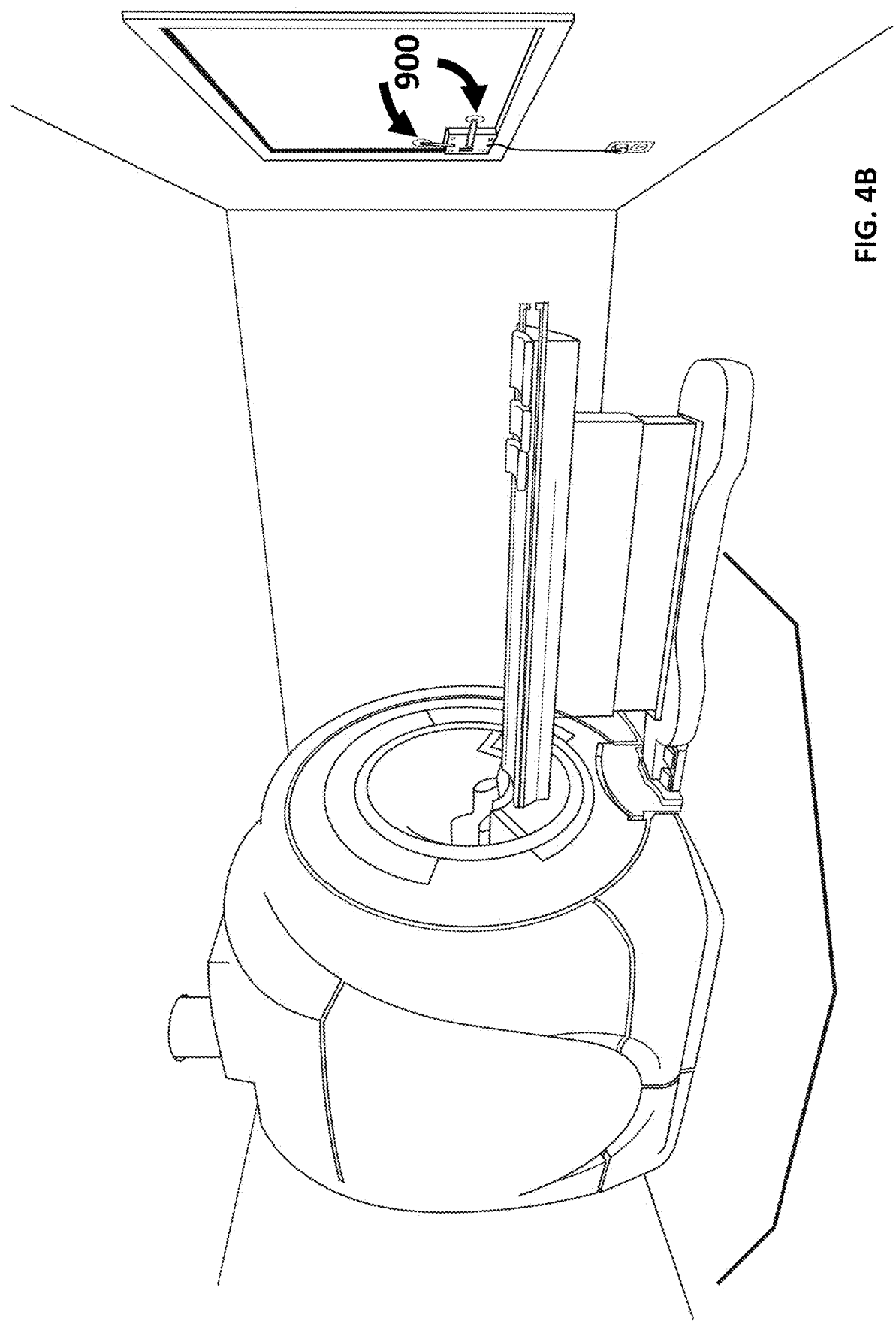
FIG. 4B shows the perspective from the MRI exam room with a LiFi module mounted on the lower left of the observation window using a mounting embodiment comprising the use of a pair of positioning arms comprising a suction cup, thin plate arm, pin, and eyelet

FIGS. 3A and 3B cover exemplary positioning and securement embodiments of the LiFi module in the control room 700 while FIGS. 4A and 4B illustrate the analogous for the exam room 800. In practice, the control room module 200 and the exam room module 300 are collectively positioned on the observation window 400 so that the LiFi transmitter within the uplink data pipeline 600 has LoS with the LiFi receiver within the same uplink data pipeline. Likewise, the control room module 200 and the exam room module 300 are collectively positioned on the observation window so that the LiFi transmitter within the downlink data pipeline 610 has LoS with the LiFi receiver within the same downlink data pipeline.

Many MRI facilities have an RF-shielded and substantially transparent observation window 400 along the common side of the adjoining exam and control rooms so the MRI technician can view the exam room directly. Generally, the observation window 400 is substantially planar and a quadrilateral with two pairs of parallel edges that form a square or rectangle-like shape. In addition, the observation window 400 is surrounded by a frame and may be somewhat recessed from the wall-outward extents of the frame. The exemplary embodiments exploit these geometric characteristics for more rapid positioning and securement and to reduce external light scattering and diffusion within the observation window by having two adjoined edges of the modules 200, 300 against the frame's corner. However, the LiFi modules 200, 300 may be placed anywhere along the observation window 400 as long as the pair is optically accessible to each other.

FIG. 3A shows the control room 700 from the vantage point of an MRI technician in the control room, exam room 800, observation window 400, rectangular window frame 401, which in this instance, extends orthogonally away from the window 400 at least several inches, the control room module 200, a power cord plugged into the module 201, and the control room equipment 101. For a rectangular window 400 and frame 401, the preferred installed module position is at one of the frame's corners where no light is incident on the window from two edges. FIG. 3A shows the control room module 200 placed along the lower right corner from the point of view of one in the control room 700. The method of module attachment is adhesive, which will be described further in the following section, LIFI MODULE SYSTEM AND EMBODIMENTS.

FIG. 3B shows much of the same, except the method of securement is a pair of positioning arms 900, each with a suction cup secured on one end and an eyelet on the opposite end that is meant to be placed around a threaded mounting stud protruding from the back (room-facing side) of the module casing. One of the positioning arms extends outward from the open (not adjacent to a frame 401) vertical end of the casing while the other arm extends outward from approximately the center of the room-facing side of the casing with both oriented in directions where the suction cups can be placed on the surface of the window 400. The exemplary relative orientation of each arm forms a 90° angle at some imaginary intersection point. Further structural details are covered in the following section, LIFI MODULE SYSTEM AND EMBODIMENTS and SYSTEM AND METHOD OF POSITIONING/ALIGNING/SECURING THE LIFI MODULE.

FIG. 4A shows a view from inside an exemplary exam room 800, window 400, window frame 402, as well as the MRI scanner 501, patient table 502, and any other ERE devices 500 not shown here that receive and/or return data through the modules 200, 300. Also shown is the exam room module 300 secured to the exam room side of the window 400 against the window frame 402 on the exam room side with adhesive and receiving power via power cord 301 from a wall outlet. Since the example shows the control room module 200 placed in the lower right corner from the vantage point of one in the control room 700, the exam room module 300 is placed in the lower left corner of the observation window from the point of view of one in the exam room 800 so that the transmitters and receivers in each of the modules 200, 300 can be aligned within LOS access of each other. It is important to note the LoS of the uplink data pipeline and the LoS of the downlink data pipeline are geometrically decoupled from each other.

FIG. 4B shows the analogy of FIG. 3B, except for the exam room LiFi module 300. The positioning arms 900 of the exam room LiFi module 300 extend out in two directions away from the frame 402 in the same manner as the positioning arms 900 for the control room LiFi module 200 are oriented.

4. LiFi Module System and Embodiments

Figure 5A:
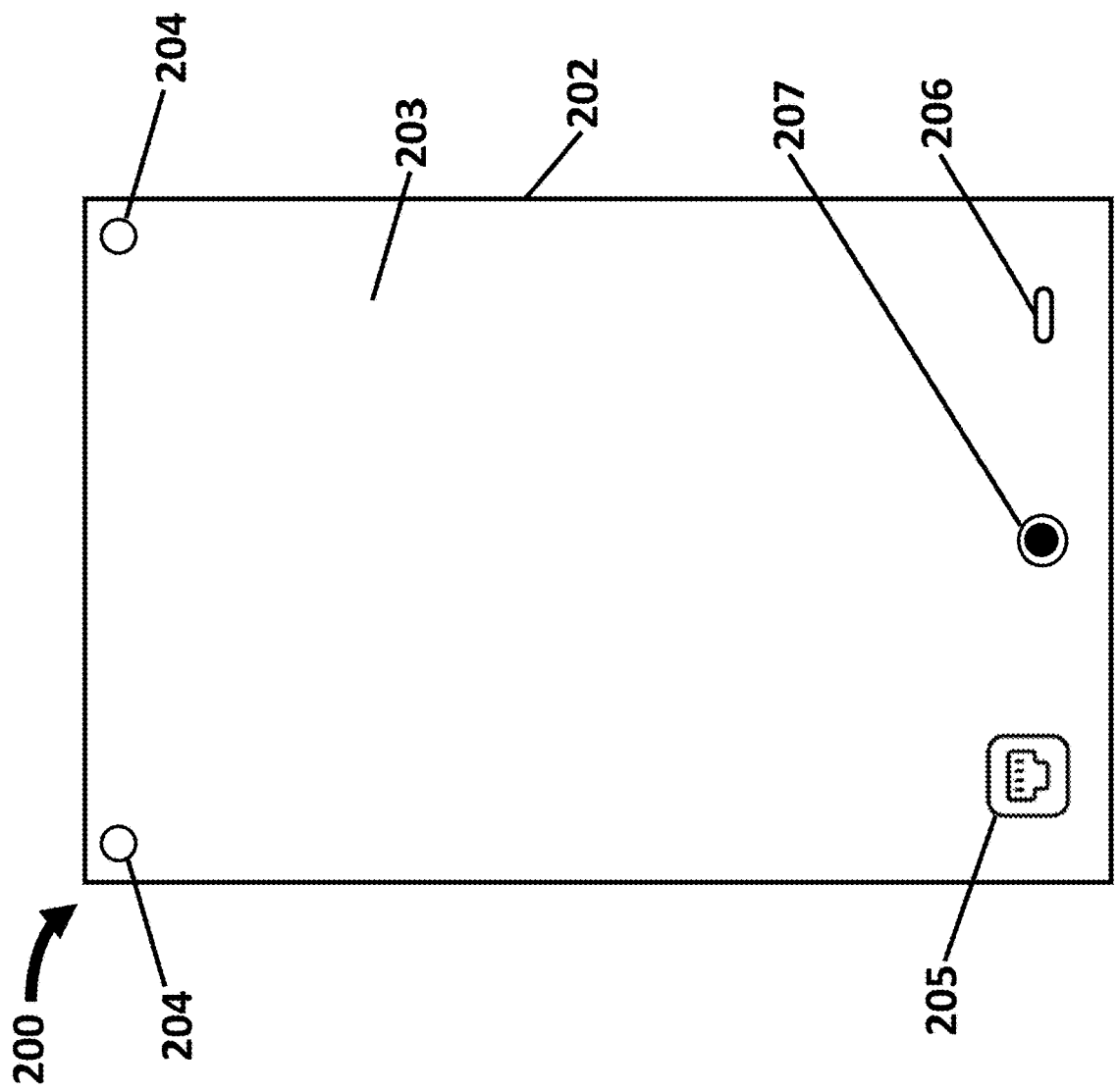
FIG. 5A is an orthogonal view showing a room-facing side of a LiFi module's casing comprising a pair of alignment holes, an ethernet jack, a power supply input port, and a USB C data connection port.
Figure 5B:
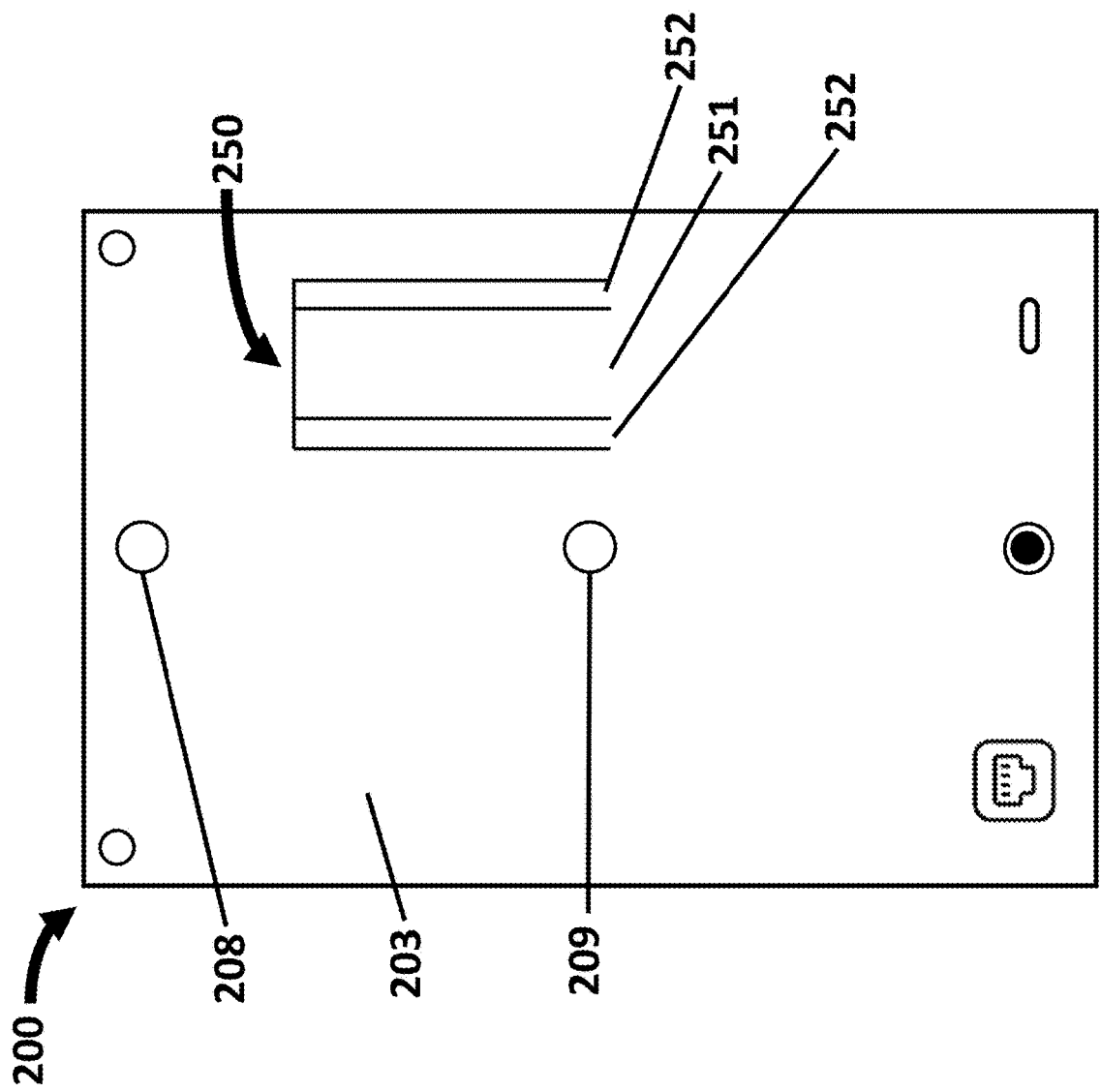
FIG. 5B is an orthogonal view showing the room-facing side of a LiFi module's casing comprising a pair of alignment holes, an ethernet jack, a power supply input port, a USB C data connection port, a pair of mounting studs integrated with the casing, and a pair of grooved channels for slidably receiving an external positioning element such as a handle
Figure 5C:
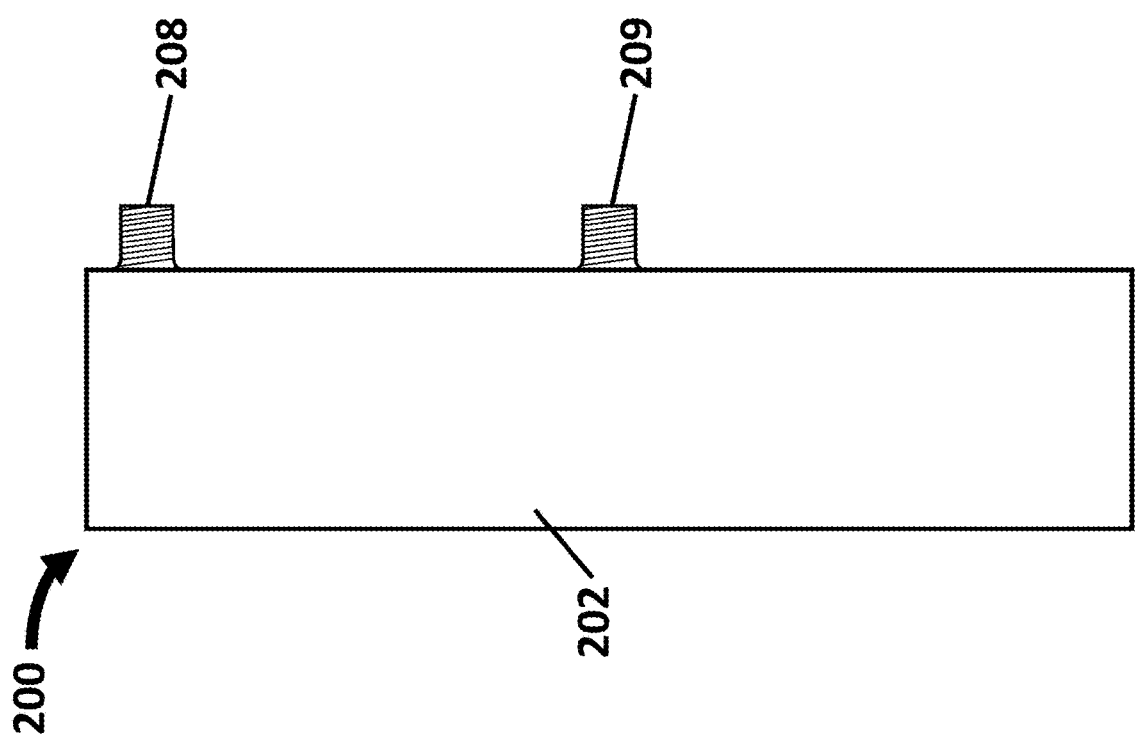
FIG. 5C is an orthogonal view showing the side of a LiFi module's casing that shows a pair of threaded mounting studs integrated with and extending outward from the casing's room-facing side to receive the eyelet end of mounting fixtures

FIGS. 5A-C show a couple of embodiments of the casing of the control room module 200, with a particular focus on the side 202 and room-facing side 203 thereof. In the exemplary embodiment, the casing of the exam room module 300 is identical to that of the control room module 200 and not shown for brevity. As such, the exemplary embodiment of the present invention is the control room module 200 and exam room module 300 with identical hexahedron form factors.

The case material for at least the exam room module 300 should be made of or lined inside with EMI/RF shielding material. The casing for at least the exam room module 300 may be made of non-ferrous metal such as titanium or aluminum or rigid plastic such as nylon, PET, or Noryl®, and others.

Furthermore, disclosed here are a couple of exemplary embodiments of the system's alignment calibration function to help verify alignment:

See-through holes 204 for both the control room module 200 placed in the upper part of the casing as shown in FIGS. 5A-B. The same holes 204 would apply for the exam room module 300.

Figure 6:
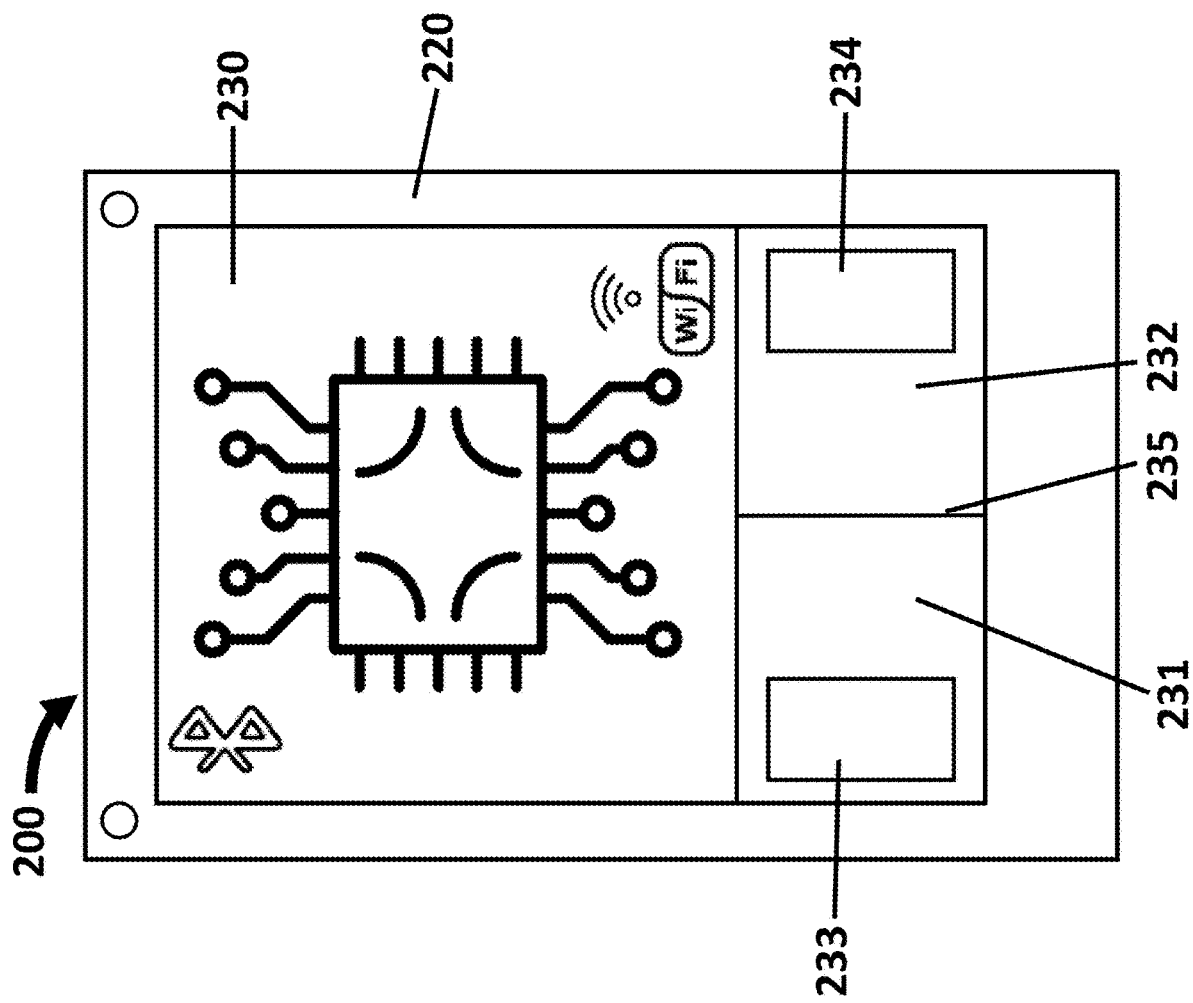
FIG. 6 is an orthogonal view showing the window-interfacing-side and layout of a LiFi module's casing comprising a pair of alignment holes or LED lights, a non-angled LiFi transmitter, a non-angled LiFi receiver, and an electronics bay where the electrical components to support communication functions reside

A pair of small LED or equivalent low-power draw lights capable of projecting from the window-interfacing-side of one of the modules at the same relative position of the holes 204 shown, as shown in FIGS. 6-7. The other module without the lights would have see-through holes 204 as described earlier in the same position illustrated in FIGS. 5A-B so that when aligned, the lights would project through the holes and be seen by the installer of the modules.

The exemplary embodiment also shows the jack or sockets for the ethernet cable 205, USB-C port 206, and power cord 207. Other types of data ports/jacks may be used and they may be placed in different areas along the room-facing side 203 or side 202 of the casing.

FIGS. 5B-C show a second embodiment of the casing designed for use with a positioning arm 900 securement approach with one or a plurality of anchor points and one or a plurality of anchor points. In the exemplary embodiment of the system's attachment function, a pair of threaded mounting studs, or anchor points, made preferably from non-ferrous metal, with one 208 near the top center and the other near the center 209, extending outward from the casing. Each threaded stud 208, 209 is designed to receive a threaded fastener like a hex nut, wing nut, etc. that is also preferably made from non-ferrous metal. The nut may also be the self-locking type or not self-locking but be used with a lock washer. Hard, wear-resistant plastic studs and fasteners are also suitable.

The threaded studs here 208, 209 are just one of several possible embodiments of anchor points for the positioning arms 900. Other approaches like a pin or post to support a cotter pin securement, where the cotter pin and casing establish the bounds of one end of the positioning arm 900. Alternatively, a hole of a snap button, post of a snap button, or a hole may be used to receive a post of a snap button, hole of a snap button, or a post of one end of the positioning arms, respectively.

To aid in the placement of the positioning arms 900, the casing may have a topology with a built-in handle such as a molded handle or in the exemplary case, one or more recessed channel(s) 252 to accept tracks attached to a separate handle. The example also shows a sliding surface 251 placed along the same plane or between the channel depth and casing back surface for the handle's bottom surface to slide on. These handle slot elements 251, 252 are preferably molded with the surface of the module's room-facing side 203.

The placement of the handle slot elements 251, 252 are offset to the right of the lateral centerline so that there will be no interference with the positioning arms if they are oriented in the north and west orientations. If the module is mounted on one of the right corners of the window 400, the handle slot elements 251, 252 are preferably offset to the right. When the module is mounted on one of the left corners of the window 400, the handle slot elements 251, 252 are preferably offset to the left, which would be the case for the exam room module 300 if the control room module 200 is mounted on one of the right corners of the window.

Other than the handle slot elements 251, 252, the case of the exam room module 300 would be the same as the case of the control room module 200 as long as the previously described considerations of the alignment lights and holes 204 are observed. Further details of how these features are used for the installation of the positioning arm embodiment are explained in the following section covering the SYSTEM AND METHOD OF POSITIONING/ALIGNING/SECURING THE LIFI MODULE.

FIGS. 6-7 show the window-interfacing-side and physical layout of the exemplary non-angled and angled embodiments of the control room module 200, respectively. Non-angled refers to a LOS between a LiFi transmitter of one module and a LiFi receiver of another module that is orthogonal to the observation window 400. Angled refers to a LOS between a LiFi transmitter of one module and a LiFi receiver of another module that is non-orthogonal to the observation window 400.

The exam room LiFi module 300 window-interfacing-side layout is preferably identical to the control room module 200. Thus for brevity, discussion will focus on the elements of the control room module 200. The periphery of the casing has a finite width surface 220 ("module seat") that mates to the window 400 and surrounds the electronics bay 230 and transmitter/receiver cavities 231, 232, 236, 237. Angled embodiments may have a finite cavity or relief volume after the LiFi transmitter 233 and LiFi receiver 234 are installed. This span of the periphery 220 as measured by the inward normal distance from the edge of the case on the window-interfacing-side may be up to or less than approximately five centimeters.

The portion of the window-interfacing-side of the casing is open where the cavities 231, 232, 236, 237 are situated. Each of the cavities 231, 232, 236, 237 is open on the window-interfacing-side to allow optical transmission of control instructions or data and return information across the observation window between the LiFi transmitter of one module and the LiFi receiver of another module.

Embodiments of this module seat 220 may have a gasket, made of EMI/RF shielding material, to serve several purposes. One is to allow the module to conform to slight window 400 surface and module seat 220 manufacturing irregularities. The second is to prevent outside light from leaking into or out of the cavities 231, 232, 236, 237 housing the LiFi transmitter 233 and LiFi receiver 234; preventing inward light leakage improves the Signal-to-Noise (SNR) ratio. The third is to help support vacuum conditions in the optical channel 604, 614, which would be the volume along the LoS between the LiFi transmitter and LiFi receiver that comprises the observation window 400. This volume along the LoS is bounded by the observation window 400, cavity relief volume if any, and the gasket itself. Alternatively, instead of vacuum, the gasket would seal the air, optical fiber, or optical couplant gel material within the optical channel 604, 614.

The gasket on the module seat 220 may additionally have a double-sided adhesive tape for the securement embodiment using adhesives. The gasket material, at least for that used for the exam room module 300, should have EMI/RF shielding properties. The adhesive tape may be part of the gasket itself. The window-facing-side of the gasket may initially have a non-stick backing that is peelable to expose adhesive just before placing one of the modules 200, 300. Finally, each module 200, 300 is mated from each module seat's surfaces to the remaining sticky exposed side of each gasket.

The nature of the adhesive may alternatively have a finite curing time to allow limited (to prevent smearing adhesive along the LiFi transmission paths) adjustment before the adhesive's full bonding strength is attained. One or more clamps may be used to temporarily secure the modules during adhesive curing.

If the uplink LiFi transmitter of the first module (control room module 200 in the figure) is on the right 233 of its window-interfacing-side, then the uplink LiFi receiver of the second module on the other side of the window 400 must be on the left side of its window-interfacing-side. This in turn means the downlink LiFi receiver of the first module needs to be on the left 234 side of the window-interfacing-side and the downlink LiFi transmitter of the second module be on the right side of its window-interfacing-side. This is more clearly illustrated later in FIG. 8.

The electronics bay 230 is the volume within the module that contains the electronic hardware to support the optical components and communication for LiFi, RF, and wired communications. For communications within the exam room 800 or within the control room 700 that does not cross the exam room RF barrier, RF communication circuitry comprising Bluetooth®, WiFi®, and NFC communication can be packaged in the electronics bay 230. Circuit provisions to assure RF wireless data integrity described earlier may also be included; such elements to assure integrity in wireless data transmission may additionally be used for LiFi optical communications. Wired communications such as those delivered by fiber optics can also be supported.

The remaining hardware comprises that which carries out most of the functions 600, 610 outlined in FIG. 2 and described in the previous section DATA PIPELINE FOR LIFI COMMUNICATIONS IN MRI APPLICATIONS. The hardware includes a transmitter block microcontroller for preprocessing, modulation, and circuit driving the LED or laser diode lamp that is recognized in the art. Another portion is the receiver block microcontroller which includes the photodiode, amplifier, and demodulator.

For the non-angled optical arrangement shown in FIG. 6, the cavity volume may just be large enough to fit the LiFi transmitter 233 or LiFi receiver 234 such that the window-facing-side of the LiFi transmitter and LiFi receiver is flush with the module seat 200 along the plane of the junction between the hard casing and any seal placed on the module seat.

Other than placing the uplink and downlink transmitter/receiver at opposite lateral extents, one can also mitigate the chances of co-channel interference (cross-talk) by placing an opaque partition 235 between the two cavities 231, 232. The partition 235 may alternatively be a portion of the gasket discussed earlier, but shaped to also surround the cavities 231, 232 when placed on a portion of the window-interfacing-side of the casing.

Alternatively, instead of having a partition 235, the two smaller cavities 231, 232 may be separated out and formed separately in a casting or molding process and a LiFi transmitter 233 is in one of the two smaller cavities while the LiFi receiver 234 is in the other of the two smaller cavities. This would create a natural opaque barrier. The window-interfacing-side of the casing is open where the two smaller cavities are situated. A gasket shaped to surround the cavities 231, 232 when placed on a portion of the window-interfacing-side of the casing and partition 235 may also be used. Alternatively, the portions of the gasket may serve as the opaque partition 235 itself.

Further alternatively, instead of a partition 235, the uplink 600 and downlink pipelines 610 may use light of differing frequencies (e.g., blue visible light for uplink, and IR for downlink) and/or spatial modulations. With this embodiment, the cavity of the control room module 200 can house both the LiFi transmitter 233 and the LiFi receiver 234 without the need for an opaque partition.

In practice, the LiFi transmitter of the control room module 200 would operate at a different optical frequency and/or spatial modulations than the LiFi receiver of the control room module, but the LiFi receiver of the exam room module 300 would operate at the same frequency and/or spatial modulations as the LiFi transmitter of the control room module, and the LiFi transmitter of the exam room module would operate at the same frequency and/or spatial modulations as the LiFi receiver of the control room module. Software/algorithms may also be alternatively applied to mitigate interference issues using techniques known in the art: interleaving and frequency domain decoupling, denoising algorithms, and AI-based deep-learning algorithms.

Another embodiment to reduce the chances of co-channel interference is to angle the LiFi transmitter/receiver 233, 234 within each of the respective cavities 236, 237 as shown in FIG. 7. In this embodiment, the transmitter and receiver 233, 234 each are necessarily recessed and angled into cavities (a.k.a., reliefs, pockets) that may take the form as shown. With this embodiment, there is no requirement for the uplink LiFi transmitter to operate within the same frequency and/or spatial modulations as the uplink LiFi receiver and no requirement for the downlink LiFi transmitter to operate within the same frequency and/or spatial modulations as the downlink LiFi receiver.

FIG. 8 shows the sectional A-A view (indicated in FIG. 7 for one of the modules) of both modules 200, 300 to show how the orientation of the uplink LiFi transmitter 233, downlink LiFi transmitter 304, uplink LiFi receiver 303, and downlink LiFi receiver 234 support non-orthogonal-to-observation-window LoS propagation in relation to the observation window 400, MRI exam room 800, and MRI control room 700. An embodiment showing the geometry of cavities 236, 237, 301, 302 is also shown. A gasket as described earlier that is further shaped to surround the cavities 236, 237 on the window-interfacing-side of the case of the control room module 200 can equivalently apply for the cavities 301, 302 on the window-interfacing-side of the case of the exam room module 300. While FIGS. 6-8 depict exemplary embodiments of each module 200, 300 with one LiFi transmitter and one LiFi receiver, it is important to note each module may have a plurality of LiFi transmitters and/or a plurality of LiFi receivers and claims referring to one LiFi transmitter or one LiFi receiver may represent a plurality of LiFi transmitters or plurality of LiFi receivers, respectively.

In practice, each of the LiFi transmitters and each of the LiFi receivers have a photon emitting/absorbing side where light projects outward or is received at an orthogonal angle, respectively. The photon emitting/absorbing side of each of the LiFi transmitters and the photon emitting/absorbing side of each of the LiFi receivers forms a tilt angle with the observation window. To assure lateral compactness of the modules 200, 300, the tilt angle is preferably in the range of 5° to 45°.

Alternative embodiments may have a plurality of small remote-control motors attached to each transmitter and receiver so that alignment may be carried out even after installation of the modules 200, 300. With this embodiment, at least two axes of adjustment would be preferred.

5. System and Method of Positioning/Aligning/Securing the LiFi Module

Figure 10A:
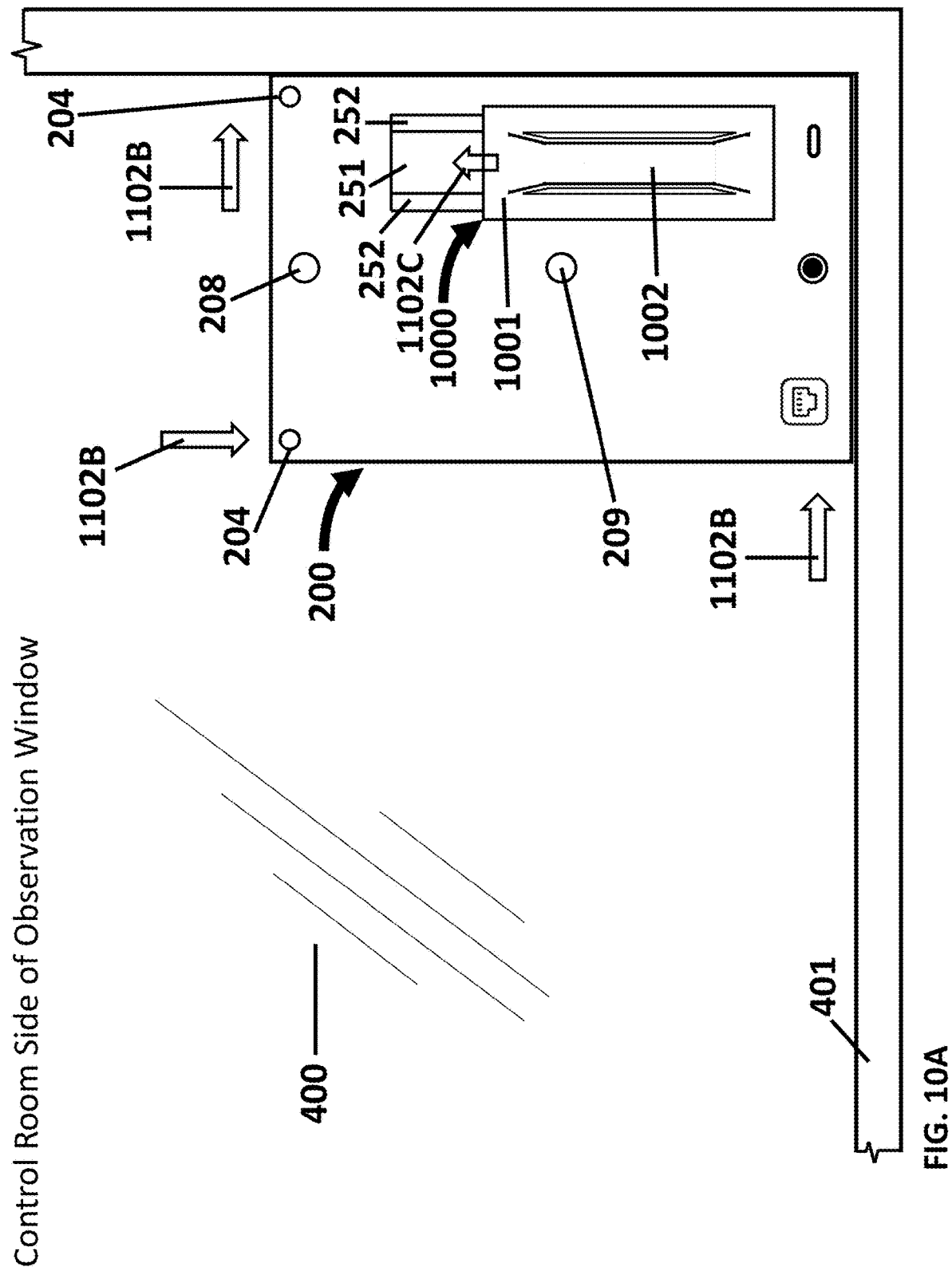
FIG. 10A is an orthogonal view illustrating the beginning steps of placing an embodiment of the LiFi module comprising a pair of mounting studs integrated with the module casing and a pair of grooved channels for slidably receiving an external positioning element such as a handle
Figure 10B:
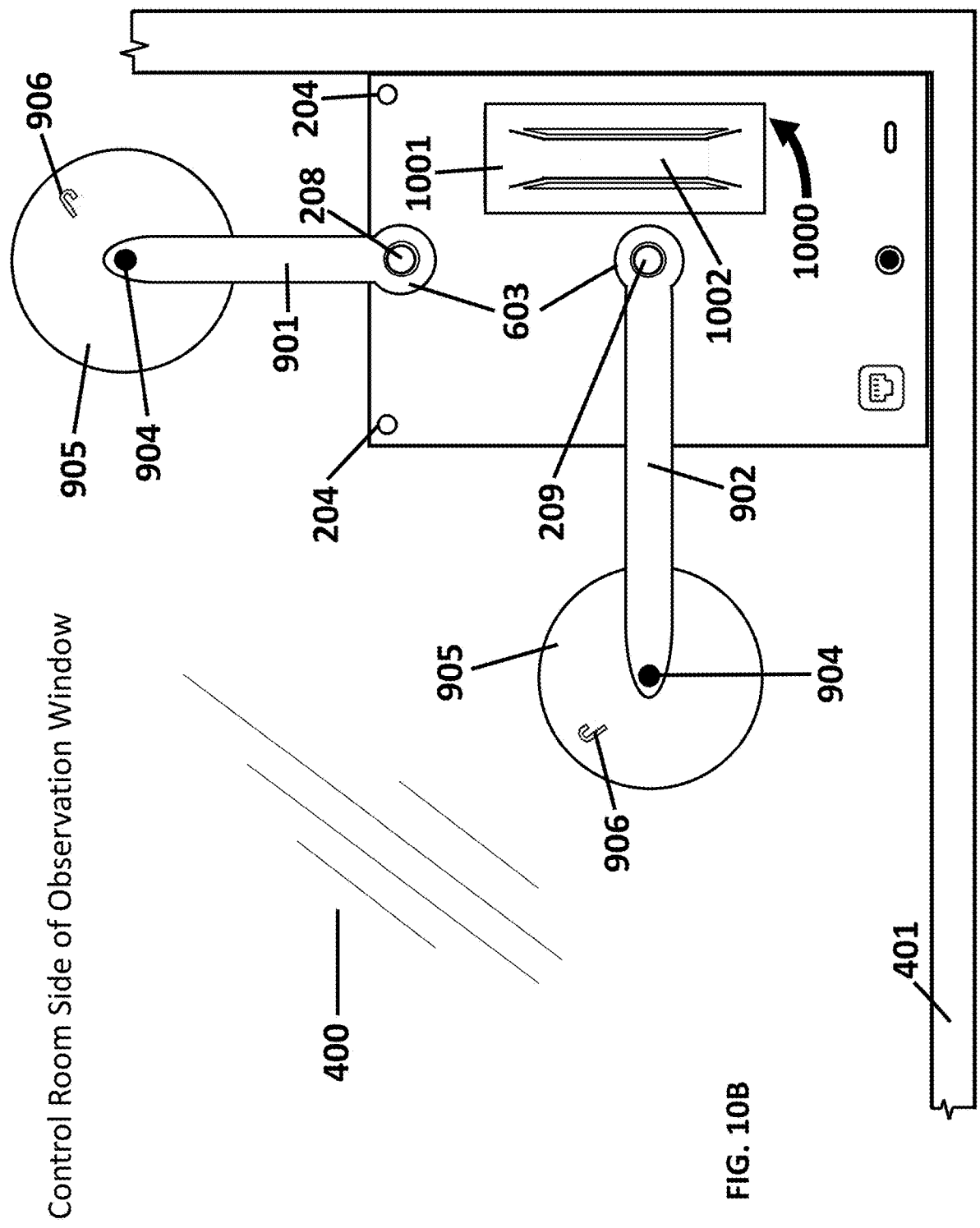
FIG. 10B is an orthogonal view that continues from FIG. 10A to show the intermediate steps of placing an embodiment of the LiFi module
Figure 11:
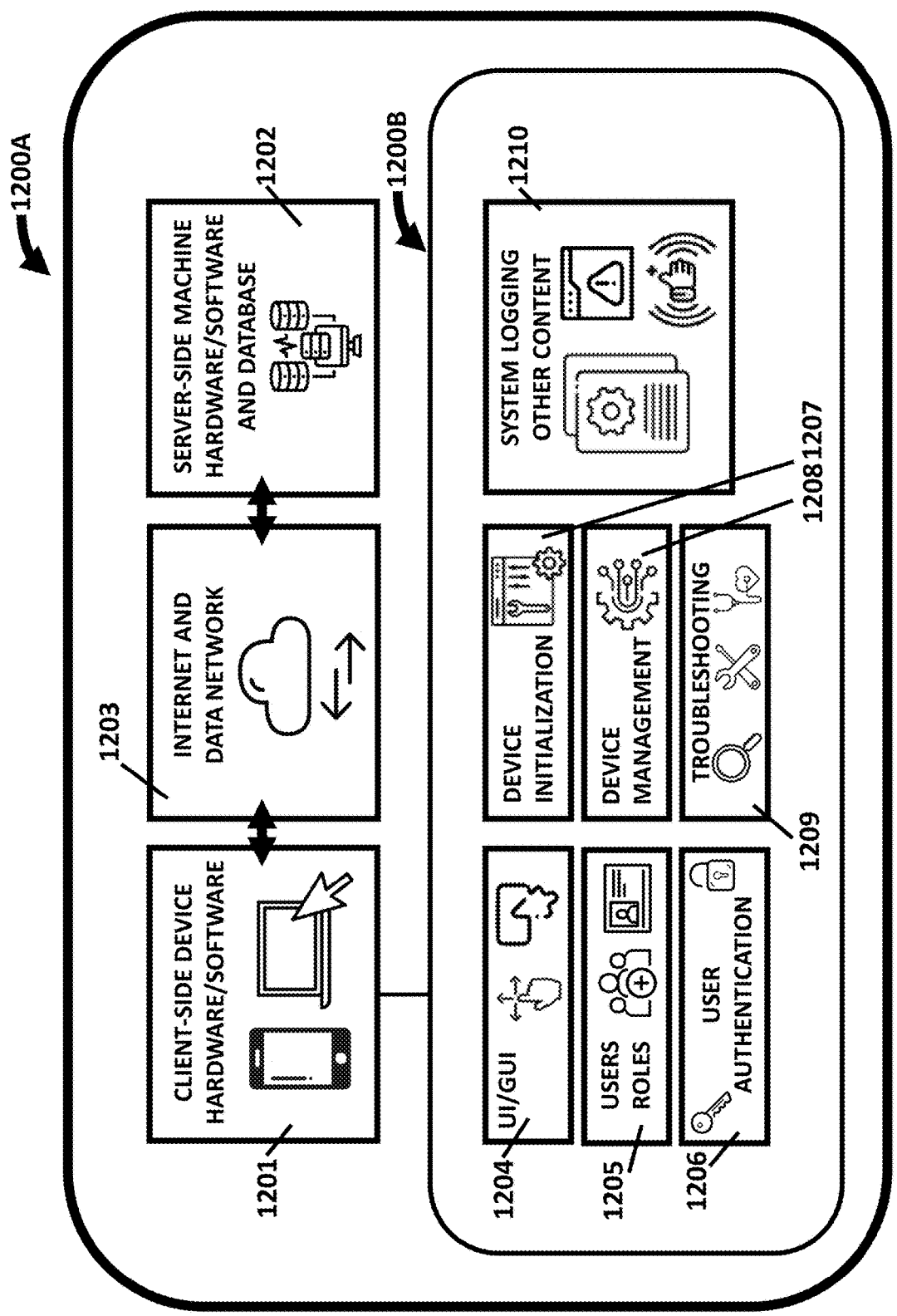
FIG. 11 is a block diagram showing the elements of the software application needed to initiate/set up, manage, and troubleshoot the operation of the LiFi communications system as adapted for MRI applications

FIG. 9 describes the steps 1100 of positioning, aligning, and securing the modules 200, 300 for the positioning arm securement embodiment with accompanying illustrations in FIGS. 10A-B. FIGS. 10A-B illustrate a configuration for the control room module 200 placed in the lower right corner of the observation window 400 up against the abutting edges of the frame 401. If the control room module 200 was placed as such, the exam room module 300 would need to be placed in the lower left corner of the observation window 400 right up against the frame 402. With the provided description, it would be understood by someone of ordinary skill in the art to specify a configuration and method that would apply to other mounting positions.

The exemplary embodiment of the alignment calibration function assumes the case of the control room module 200 and the case of the exam room module 300 each have an identical hexahedron box form. Furthermore, for the external alignment provisions to apply for aligning the optics (LiFi transmitters 233, 304 and LiFi receivers 303, 234 of the control room module 200 and exam room module 300), one or more cavities 236, 237, 301, 302 of each of the cases are shaped and positioned identically within each case and the LiFi transmitter and LiFi receiver are positioned identically within each case. Hence the external and internal construction and layout of each module 200, 300 are required to be identical.

The steps along with the accompanying description of the relevant system elements are as follows:

Step 1 (1101): Cleaning/preparing the mating surfaces of the suction cups 905 and specific portions of the window 400 where one expects the suction cups 905 to be placed. One can approximate the general window area to clean by test fitting the positioning arms 901, 902 to see where the suction cups 905 would be placed.

Step 2A (1102A): Placing the first LiFi module on the observation window 400. For illustration, the reference numbering for the control room module 200 will be used. The analogous steps and structural elements to be described below would be understood to be applicable to someone of ordinary skill in the art for the exam room module 300.

Step 2B (1102B): If placed at a corner, pushing the module casing into both frame 401 edges adjoining at the corner. FIG. 10A illustrates this action toward the lower right corner of the observation window 400.

Step 2C (1102C): If available and necessary, attaching any separate element (e.g., handle assembly 1000 with a handle base 1001 and grip 1002) that is used to assist in final positioning of the control module 200. For the exemplary embodiment, placing the handle's tracks (not shown) at the entrance of the channels 252 and sliding upward with the undersurface (not shown) of the handle's base 1001 sliding along the sliding surface 251. Embodiments of the handle assembly 1000 and handle slot elements 251, 252 may incorporate a lock and release mechanism or alternatively have an interference friction fit in the last few millimeters of travel to lock the handle assembly 1000 with the module 200.

Step 3A (1103A): Taking one positioning arm (for illustration, starting with positioning arm 901) and passing the eyelet 603 of the arm through one of the studs 208. With the exemplary configuration, each of the positioning arms 901, 902 will have different lengths and it is clear the shorter arm 901 is to be used for the top center stud 208 and the longer arm 902 for the center stud 209 so that it can extend over half the module casing's width, the casing's thickness, and allow the suction cup 905 of the longer arm to engage the window 400.

Figure 10C:
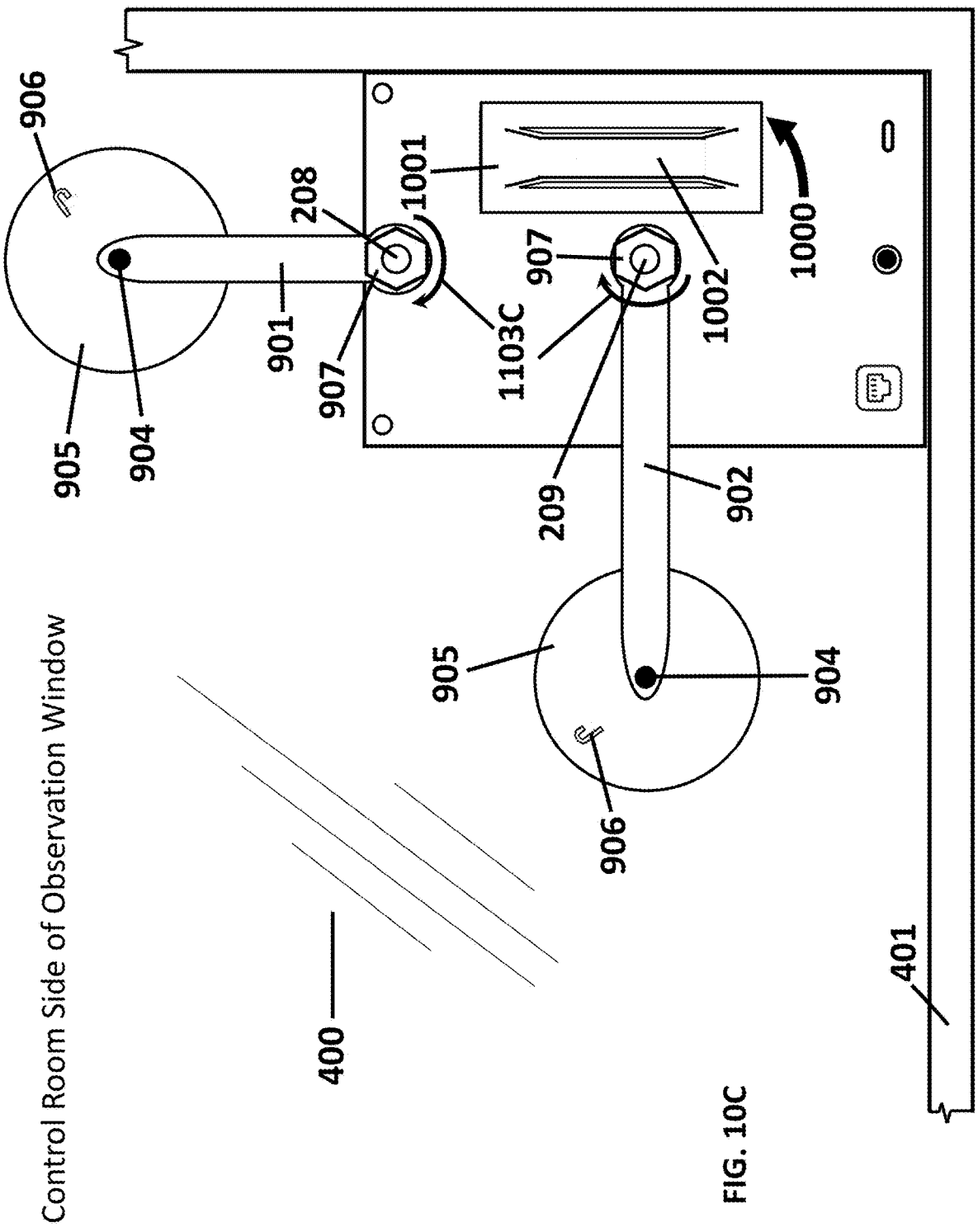
FIG. 10C is an orthogonal view that continues from FIG. 10B to show the final steps of placing an embodiment of the LiFi module

Step 3B (1103B): Swinging the shorter positioning arm 901 to its final orientation, which is where the suction cup 905 can be pressed onto the cleaned/prepped glass surface of the window 400. FIG. 10B shows the orientation of both positioning arms 901, 902 prior to securing the eyelet 603 end down to the casing. FIGS. 10B-C show each suction cup 905 at its center is coupled to one end of the positioning arm 901, 902 with a rivet or fastener that can equivalently fix the arm 901, 902 to a suction cup 905.

Step 3C (1103C): Tightening a fastener 907 around the stud 208 and pressing the suction cup 905 onto the glass 400, as shown in FIG. 10C.

Step 3D (1103D): Repeating steps 1103A-C for the other positioning arm 902, fastener 907, and stud 209.

Step 3E (1103E): When completed, the positioning arms 901, 902 should preferably form a substantially right angle. Alternative embodiments may have the positioning arms 901, 902 form non-orthogonal angles.

Step 3F (1103F): Removing any previously attached element (e.g., handle assembly 1000).

Step 4A (1104A): Placing the second module (in this example, 300) along the opposing side of the observation window 400 on the same corner of the first LiFi module and repeating Steps 1102B and 1102C as needed.

Step 4B (1104B): Aligning the second LiFi module 300 by shifting the position as needed until the LED positioning lights associated with one module shine through both alignment holes of the other module 200 or the through-holes on the first and second module casings are lined up. The means of shifting may be manual hands-in in nature by the installer.

Step 4C (1104C): Once the aligned position is achieved, repeating Step 1103 for this module and noting different part numbers as shown in FIGS. 10A-C for the other positioning arm 902 and mounting stud 209. For the second module, Step 1103 is the final step.

The positioning arms 901, 902 are made of a thin material that is unaffected by the MRI's strong magnetic field. A suitable non-ferrous metal may be titanium or aluminum. The metal may be additionally plastic coated. The arms 901, 902 may alternatively be made from a flexible plastic that is rigid in compression and tension.

The threaded studs 208, 209 in the exemplary embodiment are just one of several possible embodiments of anchor points for the positioning arms 901, 902. Other approaches were previously discussed in the section titled LIFI MODULE SYSTEM AND EMBODIMENTS. Alternative embodiments of a positioning arm anchor other than an eyelet 603 may also be used, such as a screw, bolt, or pin that is engageable with a threaded or unthreaded bore. Other embodiments can have the positioning arms 901, 902 be fixed on one end by a gimbaling ball socket and dockable on the room-facing side 203 or side 202 of the casing. The positioning arms 901, 902 may also be extendable/retractable like a telescoping antenna, which in turn necessitates a non-flexible construction. A combination of the previous elements is also possible.

The exemplary embodiment of the suction cup 905 has on its non-mating surface a pull tab 906 to break the suction bond during disassembly or adjustment. This tab 906 may have a very slender cylindrical form factor and be a small fraction of the suction cup's 905 radial dimension.

The securement embodiments need not be restricted to positioning arms 901, 902 and suction cups 905 or adhesive between the module seat 220. Having a non-ferrous external frame or fixture that is attachable to the window 400 and/or window frame 401 using fasteners may also be used. Non-ferrous straps and/or clamps may also be used.

Alternative installation embodiments may also incorporate a step where the previously mentioned silicon optical couplant gel is injected into cavities 236, 237, 301, 302 housing the transmitters and receivers. This would require a small diameter hole from the casing's exterior to the cavities 236, 237, 301, 302 so the syringe may be placed at the casing side's hole to inject the gel. The gel may also be prepackaged and sealed within the cavities 236, 237, 301, 302 to obviate the need for injection during installation.

Also alternatively, the same casing exterior to the cavity channel can be used to evacuate the cavity 236, 237, 301, 302 of air and airborne contaminants and have a plug to preserve the vacuum. The previously mentioned seal around the front face 220 of the casing will also support this cavity vacuum condition.

6. LiFi Module Software Application

FIG. 11 shows the elements of the device/network infrastructure and software 1200A and specifically the software application 1200B for LiFi module system configuration 1207, device management 1208, and diagnostics for troubleshooting 1209. This software application 1200B may be installed on the host (client) device's 1201 non-volatile memory or be remotely accessible from a server 1202 in a web-based Software-as-a-Service (SaaS) arrangement through the internet or local area network 1203. Details of the hardware, operating system, database, and non-LiFi data network infrastructure were provided earlier in the section titled LIFI COMMUNICATIONS NETWORK FOR MRI APPLICATIONS.

The server 1202 is also where data such as system information, diagnostic logs, etc. can be stored, managed, and retrieved. If remote, the storage may be identical to what is used among one of the OER devices 102 described earlier. System information may comprise details about the interfaced ERE devices 500 and control room equipment 101, client device 1201, where device information may comprise the name, system manufacturer, system product name, BIOS date, BIOS version, OS build, machine ID, etc.

The client application software 1200B employs a graphical user interface (GUI) 1204, or more generally that includes physical controls on the device, a user interface (UI) that drives user interaction with the client-side device 1201 through several input/output (I/O) elements including but not limited to: display including those that respond to touch (on a touchscreen), mouse, trackpad, keyboard (virtual or mechanical), and built-in and/or plugged-in audio output devices.

Functional requests to the software application 1200B and server 1202 can also be made with the guidance of a GUI 1204 as displayed on the client side's device display. The GUI 1204 comprises virtual windows and panels (fixed or dockable), menus, text fields, radio buttons, checkboxes, buttons, and many other "widgets" that guide the user on interacting with the client-side I/O hardware 1201 to execute the desired actions such as type, select, save, edit, view, and more actions.

Installed software on a client-side device 1201 including the kernel or operating system such as iOS® or Android®, hardware drivers, and applications including the application itself. For a SaaS variant of the application, a web browser can be used in lieu of a downloadable application. The SaaS software can be implemented under a subscription-based licensing model. Either installed or SaaS variant uses the network interface to access or send content over the network 1203 or request services from the server 1202.

Any suitable programming language may be used in accordance with the various embodiments of the invention and comprise C, C++, HTML5 for SaaS variants, Java®, Python®, and/or JavaScript®. In addition, it is not necessary that a single type of instruction or programming language be utilized in conjunction with the operation of the system and method of the invention. Rather, any number of different programming languages may be utilized as necessary or desirable. Furthermore, the GUI development can use language/widget toolkit/frameworks such as Tkinter, Flexx, Dabo, CEF, and Qt® to render visual elements are rendered using native operating system elements, for the best appearance.

The software application 1200B has provisions to add users of certain types/roles 1205. The roles are tied to specific privileges and permissions to access certain information and capabilities with the LiFi communications network 100. Roles may comprise administrator, MRI technician, network technician, engineer, and manager.

The software application 1200B has embodiment means to authenticate 1206 the user, beginning with a password or personal identification number (PIN) and embodiments can be expanded to include two-factor authentication where a code is generated by the application's server 1202 or third-party service, sent to the user generally through the internet 1203, where the user would enter a temporarily valid, service-generated code to the client-side device 1201 on hand within a brief allotted time that if correct, allows the use of the software application 1200B. Other authentication embodiments can include biometric means such as fingerprint or facial recognition.

Other software application functions more specific to LiFi communications comprise the following.

1. Initialization of device 1207 by setting up uplink and downlink connections between modules 200, 300. A self-calibration software will perform functions comprising the following to ensure a successful installation of the modules:
   a. Measure the optical signal intensity and data transportation efficiency.
   b. Test data transportation.
   c. Setup property for other wireless connection blocks (WiFi®, Bluetooth®, etc.)
2. Perform functional settings and status monitoring, including:
   a. Manage Bluetooth® devices.
   b. WiFi® network settings
   c. Configure wireless or wired connection parameters e.g., connection channels/frequencies, baud rate, protocols, etc.

Device management 1208 and troubleshooting 1209 features are also available. Embodiments of the modules 200, 300 may continually log 1210 all pertinent communication aspects of the network 100 to be stored locally or remotely. Logged information 1210 can comprise fault codes from any of the modules 200, 300, ERE devices 500, and control room equipment 101, as well as parameters like system voltage and current history, connectivity performance like Bit-Error Rate (BER) performance in each channel, a summary of the successes, failures, and warnings that are reported for the different LiFi connection sessions, duration of each communications session, application users for each connection session, SSID, and disconnect reason if any.

Many alterations and modifications may be made by those having ordinary skill in the art without departing from the spirit and scope of the embodiment. Therefore, it must be understood that the illustrated embodiment has been set forth only for the purposes of example and that it should not be taken as limiting the embodiment as defined by the following claims. For example, notwithstanding the fact that the elements of a claim are set forth below in a certain combination, it must be expressly understood that the embodiment includes other combinations of fewer, more, or different elements, which are disclosed herein even when not initially claimed in such combinations.

Android® is a registered trademark of Google Inc.
Bluetooth® is a registered trademark of Bluetooth Special Interest Group (SIG).
iOS is a registered trademark of Cisco Systems Inc.
Microsoft® and 365® are registered trademarks of Microsoft Corporation
Macintosh® is a registered trademark of Apple Inc.
Noryl® is a registered trademark of SABIC Innovative Plastics IP B.V.
Qt® is a registered trademark of The Qt Company Ltd.
Wi-Fi is a registered trademark of Wi-Fi Alliance.

What is claimed is:

1. A system for wirelessly communicating data across a magnetic resonance imaging (MRI) observation window, comprising:
   a pair of Light Fidelity (LiFi) modules;
   wherein each of said modules further comprises a LiFi transmitter and a LiFi receiver housed in a case;
   said LiFi transmitters and LiFi receivers are each part of one or more electrical circuits for carrying out functions comprising acquisition of inputs and signal processing of control instructions and return information;
   wherein an uplink data transmission pipeline comprises at least one of said electrical circuits used to acquire and signal process control instructions from an MRI control room on one side of the observation window to an MRI exam room on the opposite side of the observation window;
   wherein an MRI control room comprises any location outside of said MRI exam room;
   wherein a downlink data transmission pipeline comprises at least one of said electrical circuits used to acquire and signal process return information from said MRI exam room to said MRI control room;
   wherein each of said cases comprises a window-interfacing-side that is placeable on the observation window with or without a gasket in between said window-interfacing-side and said observation window;
   wherein at least one of said modules, referred to as a control room module, is placeable on the side of said observation window facing the MRI control room;
   wherein at least one of said modules, referred to as an exam room module, is placeable on the side of said observation window facing the MRI exam room.

2. The system of claim 1:
   wherein said control room module comprises a LiFi transmitter within said uplink data pipeline;
   wherein said exam room module comprises a LiFi receiver within said uplink data pipeline;
   wherein said exam room module further comprises a LiFi transmitter within said downlink data pipeline;
   wherein said control room module further comprises a LiFi receiver within said downlink data pipeline.

3. The system of claim 2:
wherein said control room module and said exam room module are collectively positioned on the observation window so that the LiFi transmitter within said uplink data pipeline has a line-of-sight (LoS) with the LiFi receiver within said uplink data pipeline; and
said control room module and said exam room module are collectively positioned on the observation window so that the LiFi transmitter within said downlink data pipeline has a line-of-sight (LoS) with the LiFi receiver within said downlink data pipeline;
wherein said LoS of said uplink data pipeline and said LOS of said downlink data pipeline are geometrically decoupled from each other.

4. The system of claim 2:
wherein said LiFi transmitter of said control room module is tuned at a different optical frequency and/or spatial modulations than said LiFi receiver of said control room module;
wherein said LiFi receiver of said exam room module is tuned at the same frequency and/or spatial modulations as said LiFi transmitter of said control room module;
wherein said LiFi transmitter of said exam room module is tuned at the same frequency and/or spatial modulations as said LiFi receiver of said control room module.

5. The system of claim 2:
wherein each said cases further comprises one or more cavities;
wherein each of said cavities houses either a LiFi transmitter and/or a LiFi receiver.

6. The system of claim 3, wherein the LoS of between the LiFi transmitter and the LiFi receiver of the uplink data pipeline and the LoS of between the LiFi transmitter and the LiFi receiver of the downlink data pipeline are each at a non-orthogonal angle relative to the observation window.

7. The system of claim 6:
wherein each of the LiFi transmitters and each of the LiFi receivers has a photon emitting/absorbing side where light projects outward or is received at an orthogonal angle, respectively;
wherein said photon emitting/absorbing side of each of said LiFi transmitters and said photon emitting/absorbing side of each of said LiFi receivers forms a tilt angle relative to the observation window.

8. The system of claim 1:
wherein said case of said control room module and said case of said exam room module each have an identical hexahedron box form;
wherein the opposite side of said window-interfacing-side is a room-facing-side;
wherein the LiFi transmitter and LiFi receiver are positioned identically within each case.

9. The system of claim 8:
said system further comprising an alignment calibration function;
wherein said alignment calibration function comprises said case of said control room module that further comprises a plurality of alignment holes from the window-interfacing side to the room-facing-side; and
wherein said alignment calibration function further comprises said case of said exam room module has a plurality of alignment holes from the window-interfacing side to the room-facing-side and equal in number as said plurality of alignment hoes of said case of said control room module.

10. The system of claim 8:
said system further comprising an alignment calibration function;
wherein said alignment calibration function comprises said case of said control room module or the case of said exam control room module further comprises a plurality of alignment holes from the window-interfacing side to the room-facing-side; and
said case of the module without the alignment holes has a plurality of alignment lights from the case's window-interfacing-side aimed in an outward normal direction;
wherein the number of alignment lights is the same as the number of alignment holes;
wherein the position of each alignment light is such that every alignment light projects through said alignment holes when all edges of the window-facing-side of the case with alignment holes lines up with all edges of the window-facing-side of the case with alignment lights.

11. The system of claim 8:
said system further comprising an attachment function;
wherein said attachment function comprises said case further comprising a single or a plurality of positioning arm anchor points on the room-facing-side of said case of said control room module and room-facing-side of said case of said exam room module.

12. The system of claim 11, wherein each of said anchor points is either a threaded post capable of receiving a threaded fastener, post without threads, hole of a snap button, post of a snap button, or a hole.

13. The system of claim 12, further comprising:
a single or a plurality of positioning arms equal to the number of anchor points;
said positioning arms each having two ends;
wherein one end engageable to one of said anchor points is either a threaded faster, eyelet, post of a snap button, hole of a snap button, or a pin.

14. The system of claim 13, wherein a suction cup is attached to one of said ends of said positioning arm opposite to the end engageable to one of said anchor points.

15. The system of claim 8, wherein said room-facing-side of said case further comprises a handle, wherein said handle is either molded with the case or attachable and detachable to said room-facing-side of said case.

16. The system of claim 1:
wherein said window-interfacing-side of each case of said LiFi module has a periphery whose span is up to or less than five centimeters from the edge of the window-interfacing side to serve as a module seat;
said system further comprising a gasket with a first side and a second side;
said gasket for at least the exam room module is made from EMI/RF shielding material;
said first side of said ring gasket shaped to mate entirely with the module seat;
said second side of said gasket is capable of being placed on the observation window to form a seal between said case of said LiFi module and said observation window.

17. The system of claim 16:
wherein each said cases further comprises one or more cavities;
wherein each of said cavities houses either a LiFi transmitter and/or a LiFi receiver;
wherein said gasket is further shaped to surround said cavities.

18. The system of claim 1, wherein said case of the exam room module is made of EMI/RF shielding material and/or lined with EMI/RF shielding material.

19. The system of claim 3:
wherein an uplink optical channel is along the LoS between the LiFi transmitter and the LiFi receiver of the uplink data pipeline;
wherein a downlink optical channel is along the LoS between the LiFi transmitter and the LiFi receiver of the downlink data pipeline;
wherein the uplink optical channel may comprise of air, vacuum evacuated of dust and particles, optical fiber, or a silicon optical couplant;
wherein the downlink optical channel may comprise of air, vacuum evacuated of dust and particles, optical fiber, or said silicon optical couplant.

20. The system of claim 1:
wherein said control room module is wirelessly connectable with and/or connectable using a wire with one or a plurality of electrical wires to exchange data with a device or a plurality of devices within the MRI control room;
wherein said exam room module is wirelessly connectable with and/or connectable using a wire with one or a plurality of electrical wires to exchange data with a device or a plurality of devices within the MRI exam room.

* * * * *